(12) United States Patent
Koshihara et al.

(10) Patent No.: US 11,997,908 B2
(45) Date of Patent: May 28, 2024

(54) ELECTRO-OPTICAL DEVICE AND ELECTRONIC APPARATUS

(71) Applicant: SEIKO EPSON CORPORATION, Tokyo (JP)

(72) Inventors: Takeshi Koshihara, Matsumoto (JP); Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 308 days.

(21) Appl. No.: 17/317,860

(22) Filed: May 11, 2021

(65) Prior Publication Data

US 2021/0359016 A1  Nov. 18, 2021

(30) Foreign Application Priority Data

May 12, 2020 (JP) .................... 2020-083828

(51) Int. Cl.
*H10K 59/38* (2023.01)
*H10K 59/35* (2023.01)

(52) U.S. Cl.
CPC .......... *H10K 59/38* (2023.02); *H10K 59/353* (2023.02)

(58) Field of Classification Search
CPC ...... H10K 59/38; H10K 59/353; H01L 24/11; H01L 24/742; H01L 2224/117; H01L 2224/1181; H01L 2224/11849
See application file for complete search history.

(56) References Cited

U.S. PATENT DOCUMENTS

| 11,020,015 | B2* | 6/2021 | Rege ................. A61B 5/721 |
| 2011/0095276 | A1 | 4/2011 | Imai et al. |
| 2014/0124802 | A1* | 5/2014 | Do ................. H01L 25/0753 257/89 |
| 2016/0025302 | A1* | 1/2016 | Shiratori ............... H10K 59/38 362/231 |
| 2018/0277610 | A1 | 9/2018 | Kubota et al. |
| 2019/0035862 | A1 | 1/2019 | Koshihara |
| 2019/0273122 | A1 | 9/2019 | Iwasaki et al. |
| 2020/0295091 | A1 | 9/2020 | Iwasaki et al. |
| 2022/0392879 | A1* | 12/2022 | Chae .................. H01L 33/50 |

FOREIGN PATENT DOCUMENTS

| JP | 2011-090894 | 5/2011 |
| JP | 2016-136235 | 7/2016 |
| JP | 2018084781 | 5/2018 |
| JP | 2018163734 | 10/2018 |
| JP | 2019-117941 | 7/2019 |
| JP | 2019153411 | 9/2019 |

* cited by examiner

*Primary Examiner* — Karen Kusumakar
*Assistant Examiner* — Shawn Shaw Muslim
(74) *Attorney, Agent, or Firm* — JCIPRNET

(57) ABSTRACT

An electro-optical device includes a first light-emitting element configured to emit light in a first wavelength region, a second light-emitting element configured to emit light in a second wavelength region shorter than the first wavelength region, a third light-emitting element configured to emit light in a third wavelength region shorter than the second wavelength region, a first filter configured to transmit light in the first wavelength region and light in the second wavelength region and absorb light in the third wavelength region, and a second filter configured to transmit light in the second wavelength region and light in the third wavelength region and absorb light in the first wavelength region.

6 Claims, 10 Drawing Sheets

ELECTRO-OPTICAL DEVICE AND ELECTRONIC APPARATUS

The present application is based on, and claims priority from JP Application Serial Number 2020-083828, filed May 12, 2020, the disclosure of which is hereby incorporated by reference herein in its entirety.

BACKGROUND

1. Technical Field

The present disclosure relates to an electro-optical device and an electronic apparatus.

2. Related Art

Electro-optical devices including a light-emitting element such as an organic electroluminescent (EL) element are known. This type of device includes, for example, a color filter configured to transmit, of light from the light-emitting element, light of a predetermined wavelength region, as disclosed in JP-A-2019-117941.

JP-A-2019-117941 includes a plurality of sub-pixels including a light-emitting element, and a plurality of color filters corresponding to each of the sub-pixels. Specifically, a red color filter is disposed overlapping a light-emitting element capable of emitting red light, a green color filter is disposed overlapping a light-emitting element capable of emitting green light, and a blue color filter is disposed overlapping a light-emitting element capable of emitting blue light.

In the device described in JP-A-2019-117941, a color filter corresponding to light in the wavelength region emitted from the light-emitting element is arranged for each sub-pixel. Therefore, in this device, when a width of the sub-pixels decreases or a density of the sub-pixels increases, there is a possibility that visual field angle characteristics will deteriorate.

SUMMARY

According to an aspect of the present disclosure, an electro-optical device includes a first light-emitting element configured to emit light in a first wavelength region, a second light-emitting element configured to emit light in a second wavelength region shorter than the first wavelength region, a third light-emitting element configured to emit light in a third wavelength region shorter than the second wavelength region, a first filter configured to transmit light in the first wavelength region and light in the second wavelength region and absorb light in the third wavelength region, and a second filter configured to transmit light in the second wavelength region and light in the third wavelength region and absorb light in the first wavelength region.

According to an aspect of the present disclosure, an electronic apparatus includes the above-described electro-optical device and a control unit configured to control operation of the electro-optical device.

DESCRIPTION OF EXEMPLARY EMBODIMENTS

Figure 1:
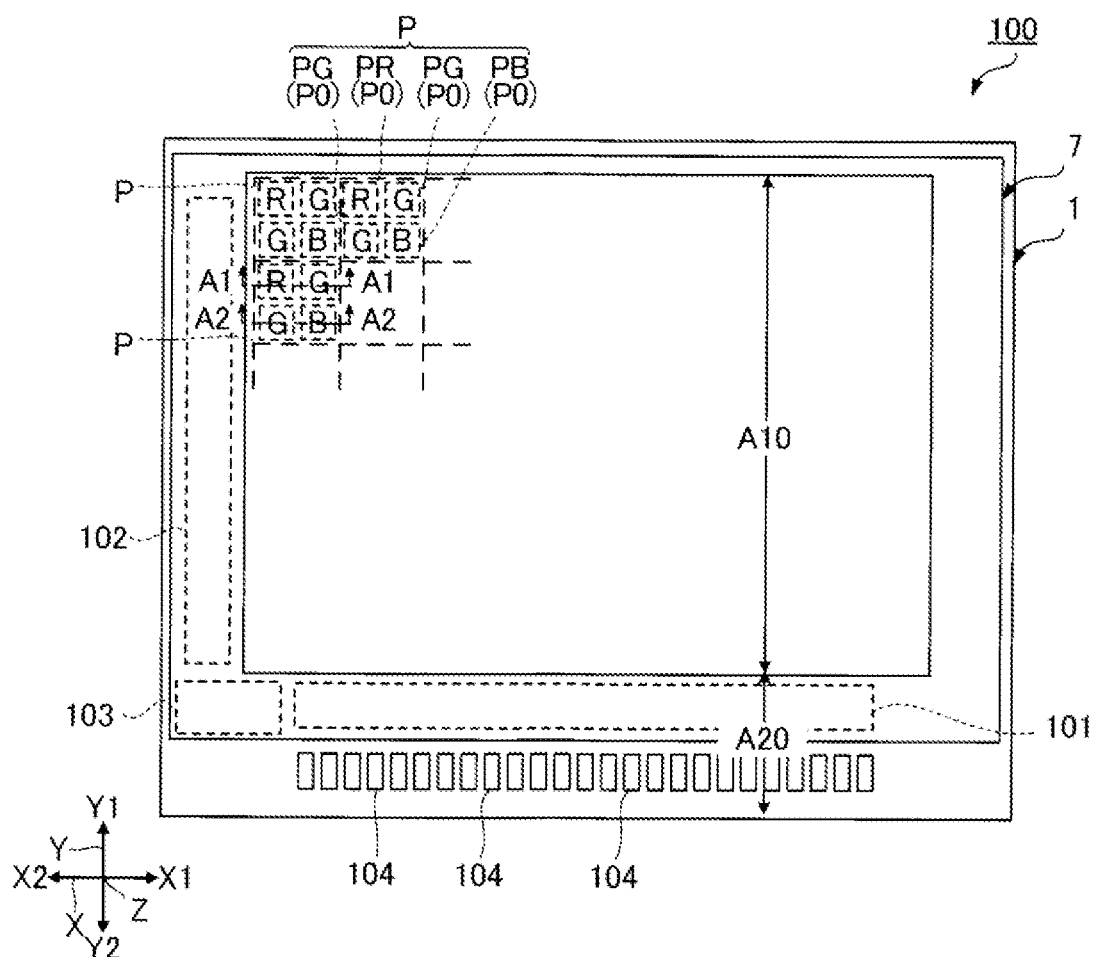
FIG. 1 is a plan view schematically illustrating an electro-optical device according to a first exemplary embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Device 100

1. First Exemplary Embodiment

1A-1. Configuration of Electro-Optical Device 100

FIG. 1 is a plan view schematically illustrating an electro-optical device 100 according to a first exemplary embodiment. Note that, for convenience of explanation, hereinafter description will be made appropriately using an X-axis, a Y-axis, and a Z-axis orthogonal to each other. Further, one direction along the X-axis is referred to as an X1 direction, and a direction opposite the X1 direction is referred to as an X2 direction. Similarly, one direction along the Y-axis is referred to as a Y1 direction, and a direction opposite the Y1 direction is referred to as a Y2 direction. One direction along the Z-axis is referred to as a Z1 direction, and a direction opposite the Z1 direction is referred to as a Z2 direction. A plane containing the X-axis and the Y-axis is referred to as an X-Y plane. Further, a view in the Z1 direction or the Z2 direction is referred to as "plan view".

The electro-optical device 100 illustrated in FIG. 1 is an example of a device that utilizes an organic electroluminescent (EL) device to display a full color image. Note that the image includes an image displaying character information only. The electro-optical device 100 serves as a micro display suitably used in a head-mounted display, for example.

The electro-optical device 100 includes a display area A10 in which an image is displayed, and a peripheral area A20 surrounding a periphery of the display area A10 in plan view. In the example illustrated in FIG. 1, a shape of the display area A10 in plan view is quadrangular, but the shape is not limited thereto, and may be another shape.

The display area A10 includes a plurality of pixels P. Each of the pixels P is the smallest unit in the display of an image. In this exemplary embodiment, the plurality of pixels P are disposed in rows and columns in the X1 direction and the Y2 direction. Each of the pixels P includes a sub-pixel PR from which light in a red wavelength region is obtained, a sub-pixel PB from which light in a blue wavelength region is obtained, and two sub-pixels PG from which light in a green wavelength region is obtained. One pixel P of the color image is constituted by one sub-pixel PB, one sub-pixel PG, and one sub-pixel PR. Note that, in the below, when the sub-pixel PB, the sub-pixel PG, and the sub-pixel PR are not differentiated, they are expressed as a sub-pixel P0.

The sub-pixel P0 is an element constituting the pixel P. The sub-pixel P0 is the smallest unit independently controlled. The sub-pixel P0 is controlled independently from the other sub-pixels P0. A plurality of the sub-pixels P0 are disposed in rows and columns in the X1 direction and the Y2 direction. Further, in this exemplary embodiment, an array of the sub-pixels P0 is a Bayer array. The Bayer array in this exemplary embodiment is an array in which one sub-pixel PR, one sub-pixel PB, and two sub-pixels PG form one pixel P. In the Bayer array, the two sub-pixels PG are disposed diagonally with respect to an array direction of the pixels P.

Here, the red wavelength region corresponds to a "first wavelength region", the green wavelength region corresponds to a "second wavelength region", and the blue wavelength region corresponds to a "third wavelength region". Note that the "first wavelength region", the "second wavelength region", and the "third wavelength region" are wavelength regions that differ from each other. The blue wavelength region is a wavelength region shorter than the green wavelength region, and the green wavelength region is a wavelength region shorter than the red wavelength region.

Further, the electro-optical device 100 includes an element substrate 1 and a light-transmitting substrate 7 having optical transparency. The electro-optical device 100 has a so-called top-emission structure, and emits light from the light-transmitting substrate 7. Note that the direction in which the element substrate 1 and the light-transmitting substrate 7 overlap coincides with the Z1 direction or the Z2 direction. Further, "optical transparency" refers to transparency with respect to visible light, and preferably a transmittance of visible light is greater than or equal to 50%.

The element substrate 1 includes a data line drive circuit 101, a scanning line drive circuit 102, a control circuit 103, and a plurality of external terminals 104. The data line drive circuit 101, the scanning line drive circuit 102, the control circuit 103, and the plurality of external terminals 104 are disposed in the peripheral area A20. The data line drive circuit 101 and the scanning line drive circuit 102 are peripheral circuits configured to control the driving of each component constituting the plurality of sub-pixels P0. The control circuit 103 is configured to control display of an image. Image data are supplied to the control circuit 103 from an upper circuit (not illustrated). The control circuit 103 is configured to supply various signals based on the image data to the data line drive circuit 101 and the scanning line drive circuit 102. Although not illustrated, a flexible printed circuit (FPC) board or the like for electrical coupling with the upper circuit is coupled to the external terminals 104. Further, the display element 1 is electrically coupled to a power supply circuit (not illustrated).

The light-transmitting substrate 7 is a cover configured to protect a light-emitting element 20 and a color filter 5, described later, of the element substrate 1. The light-transmitting substrate 7 is formed of, for example, a glass substrate or a quartz substrate.

Figure 2:
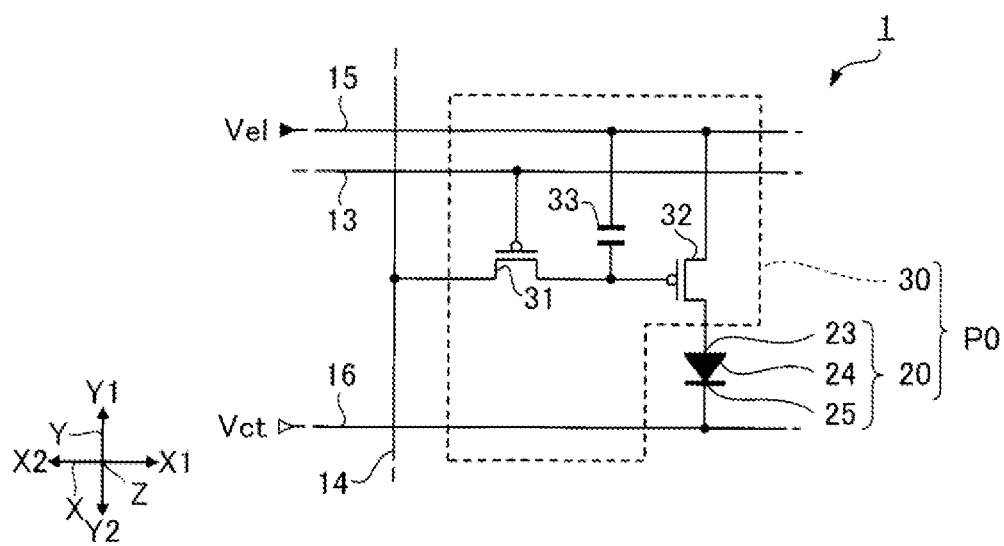
FIG. 2 is an equivalent circuit diagram of a sub-pixel illustrated in FIG. 1.

FIG. 2 is an equivalent circuit diagram of the sub-pixel P0 illustrated in FIG. 1. The element substrate 1 is provided with a plurality of scanning lines 13, a plurality of data lines 14, a plurality of power supplying lines 15, and a plurality of power supplying lines 16. In FIG. 2, one sub-pixel P0 and a corresponding element are representatively illustrated.

The scanning line 13 extends in the X1 direction and the data line 14 extends in the Y2 direction. Note that, although not illustrated, the plurality of scanning lines 13 and the plurality of data lines 14 are arrayed in a lattice shape. Further, the scanning line 13 is coupled to the scanning line drive circuit 102 illustrated in FIG. 1, and the data line 14 is coupled to the data line drive circuit 101 illustrated in FIG. 1.

As illustrated in FIG. 2, the sub-pixel P0 is provided with the light-emitting element 20 and a pixel circuit 30 configured to control driving of the light-emitting element 20.

The light-emitting element 20 is constituted by an organic light-emitting diode (OLED). The light-emitting element 20 includes a pixel electrode 23, a common electrode 25, and an organic layer 24.

The power supplying line 15 is electrically coupled to the pixel electrode 23 via the pixel circuit 30. On the other hand, the power supplying line 16 is electrically coupled to the common electrode 25. Here, a power supply potential Vel on a high potential side is supplied from the power supply circuit (not illustrated) to the power supplying line 15. A power supply potential Vct on a low potential side is supplied from the power supply circuit (not illustrated) to the power supplying line 16. The pixel electrode 23 functions as an anode, and the common electrode 25 functions as a cathode. In the light-emitting element 20, holes supplied from the pixel electrode 23 and electrons supplied from the common electrode 25 are recombined in the organic layer 24, and the organic layer 24 produces light. Note that the pixel electrode 23 is provided to each sub-pixel P0, and the pixel electrode 23 is controlled independently from the other pixel electrodes 23.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supplying line 15, and the other is electrically coupled to the pixel electrode 23. Further, one of electrodes of the retention capacitor 33 is coupled to the gate of the driving transistor 32, and the other electrode is coupled to the power supplying line 15.

In the pixel circuit 1 described above, when the scanning line 13 is selected by activating a scanning signal by the scanning line drive circuit 102, the switching transistor 31 provided in the selected sub-pixel P0 is turned on. Then, a data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the light-emitting element 20. Then, the light-emitting element 20 emits light at a luminance corresponding to a magnitude of the current supplied from the driving transistor 32. Further, when the scanning line drive circuit 102 releases the selection of the scanning line 13 and the switching transistor 31 is turned off, the potential of the gate of the driving transistor 32 is held by the retention capacitor 33. Therefore, the light-emitting element 20 can maintain emission of the light of the light-emitting element 20 even after the switching transistor 31 is turned off.

Note that the configuration of the pixel circuit 30 described above is not limited to the illustrated configuration. For example, the pixel circuit 30 may further include a transistor that controls the conduction between the pixel electrode 23 and the driving transistor 32.

1A-2. Element Substrate 1

Figure 3:
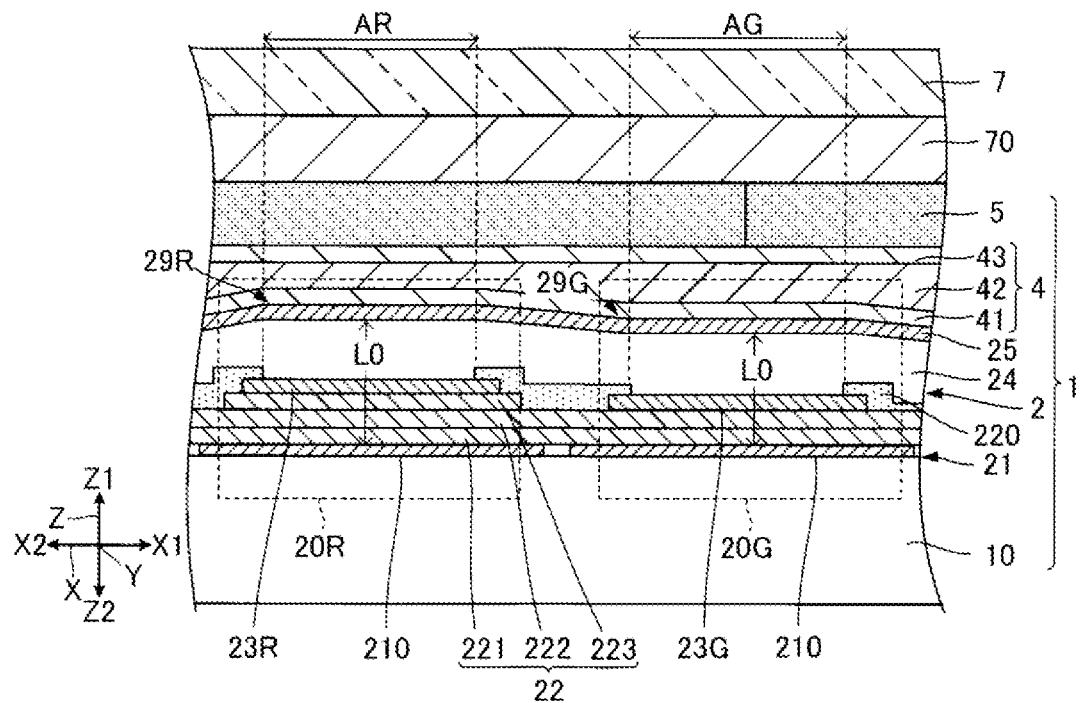
FIG. 3 is a diagram illustrating a cross section taken along line A1-A1 illustrated in FIG. 1.
Figure 4:
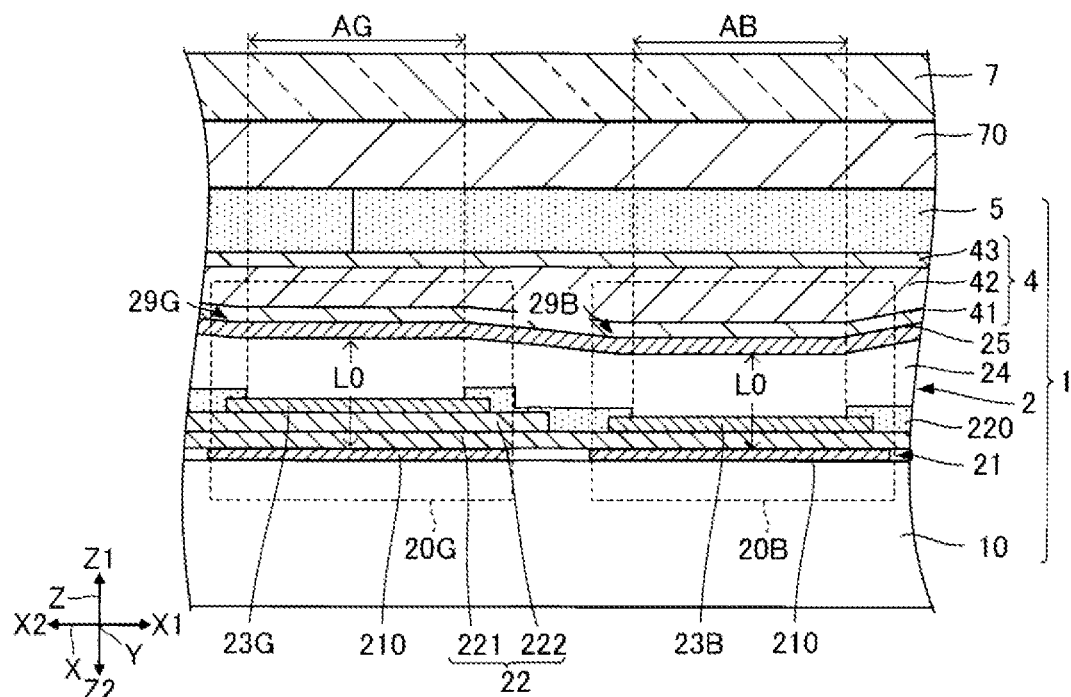
FIG. 4 is a diagram illustrating a cross section taken along line A2-A2 illustrated in FIG. 1.

FIG. 3 is a diagram illustrating a cross section taken along line A1-A1 illustrated in FIG. 1. FIG. 4 is a diagram illustrating a cross section taken along line A2-A2 illustrated in FIG. 1. In the following description, the Z1 direction is upward and the Z2 direction is downward. In the following, "B" is added to the end of a reference sign of an element related to the sub-pixel PB, "G" is added to the end of a reference sign of an element related to the sub-pixel PG, and "R" is added to the end of a reference sign of an element related to the sub-pixel PR. Note that when no distinction is made for each emission color, the "B", "G", and "R" at the end of the reference signs are omitted.

As illustrated in FIG. 3 and FIG. 4, the element substrate 1 includes a substrate 10, a reflection layer 21, a light-emitting element layer 2, a protective layer 4, and the color filter 5. Note that the light-transmitting substrate 7 described above is bonded to the element substrate 1 by an adhesive layer 70.

Although not illustrated in detail, the substrate 10 is a wiring substrate on which the pixel circuit 30 described above is formed on a silicon substrate, for example. Note that, instead of a silicon substrate, a glass substrate, a resin substrate, or a ceramic substrate, for example, may be used. Moreover, while not illustrated in detail, each of the aforementioned transistors included in the pixel circuit 30 may be a metal oxide semiconductor (MOS) transistor, a thin film transistor, or a field effect transistor. When the transistor included in the pixel circuit 30 is a MOS transistor including an active layer, the active layer may be constituted by a silicon substrate. Further, examples of a material for each element and each type of wiring included in the pixel circuit 30 include polysilicon, metal, metal silicide, and a metallic compound.

The reflection layer 21 is disposed on the substrate 10. The reflection layer 21 includes a plurality of reflection sections 210 having light reflectivity. Further, "light reflectivity" refers to reflectivity with respect to visible light, and preferably means that a reflectance of visible light is greater than or equal to 50%. Each reflection section 210 reflects light generated in the organic layer 24. Note that, although not illustrated, the plurality of reflection sections 210 are disposed in rows and columns corresponding to the plurality of sub-pixels P0. Examples of a material of the reflection layer 21 include metals such as aluminum (Al) and silver (Ag), or alloys of these metals. Note that the reflection layer 21 may function as a wiring electrically coupled to the pixel circuit 30. Further, the reflection layer 21 may be considered as a portion of the light-emitting element layer 2.

The light-emitting element layer 2 is disposed on the reflection layer 21. The light-emitting element layer 2 is a layer in which a plurality of the light-emitting elements 20 are provided. The light-emitting element layer 2 includes an insulating layer 22, an element separation layer 220, a plurality of the pixel electrodes 23, the organic layer 24, and the common electrode 25. The insulating layer 22, the element separation layer 220, the organic layer 24, and the common electrode 25 are common to the plurality of light-emitting elements 20.

The insulating layer 22 is a distance adjustment layer that adjusts an optical distance L0 being an optical distance between the reflection layer 21 and the common electrode 25 described later. The insulating layer 22 is constituted by a plurality of films having insulating properties. Specifically, the insulating layer 22 includes a first insulating film 221, a second insulating film 222, and a third insulating film 223. The first insulating film 221 covers the reflection layer 21. The first insulating film 221 is commonly formed in pixel electrodes 23B, 23G, 23R. The second insulating film 222 is disposed on the first insulating film 221. The second insulating film 222 overlaps the pixel electrodes 23R, 23G in plan view, and does not overlap the pixel electrode 23B in plan view. The third insulating film 223 is disposed on the second insulating film 222. The third insulating film 223 overlaps the pixel electrode 23R in plan view, and does not overlap the pixel electrodes 23B, 23G in plan view.

The element separation layer 220 including a plurality of openings is disposed on the insulating layer 22. The element separation layer 220 covers each outer edge of the plurality of pixel electrodes 23. A plurality of light-emitting regions A are defined by the plurality of openings included in the element separation layer 220. Specifically, a light-emitting region AR included in a light-emitting element 20R, a light-emitting region AG included in a light-emitting element 20G, and a light-emitting region AB included in a light-emitting element 20B are defined.

Examples of materials of the insulating layer 22 and the element separation layer 220 include silicon-based inorganic materials such as silicon oxide and silicon nitride. Note that, in the insulating layer 22 illustrated in FIG. 3, the third insulating film 223 is disposed on the second insulating film 222, but the second insulating film 222 may be disposed on the third insulating film 223, for example.

The plurality of pixel electrodes 23 are disposed on the insulating layer 27. The plurality of pixel electrodes 23 are provided in a one-to-one manner with the plurality of sub-pixels P0. Although not illustrated, each pixel electrode 23 overlaps the corresponding reflection section 210 in plan view. Each pixel electrode 23 has optical transparency and electrical conductivity. Further, examples of the material of the pixel electrode 23 include a transparent conductive material such as indium tin oxide (ITO) or indium zinc oxide (IZO). The plurality of pixel electrodes 23 are electrically isolated from each other by the element separation layer 220.

The organic layer 24 is disposed on the plurality of pixel electrodes 23. The organic layer 24 includes a light-emitting layer including an organic light-emitting material. The organic light-emitting material is an organic compound having luminosity. Further, in addition to the light-emitting layer, the organic layer 24 includes, for example, a hole injection layer, a hole transport layer, an electron transport layer, and an electron injection layer. The organic layer 24 includes a light-emitting layer from which light emission colors of blue, green, and red are obtained to realize white light emission. Note that the configuration of the organic layer 24 is not particularly limited to the configuration described above, and a known configuration can be applied.

On the organic layer 24, the common electrode 25 is disposed. The common electrode 25 is disposed on the organic layer 24. The common electrode 25 has light reflectivity, optical transparency, and electrical conductivity. The common electrode 25 is formed of an alloy including Ag, such as MgAg, for example.

In the light-emitting element layer 2 described above, the light-emitting element 20R includes the first insulating film 221, the second insulating film 222, the third insulating film 223, the element separation layer 220, the pixel electrode 23R, the organic layer 24, and the common electrode 25. The light-emitting element 20G includes the first insulating film 221, the second insulating film 222, the element separation layer 220, the pixel electrode 23G, the organic layer 24, and the common electrode 25. The light-emitting element 20B includes the first insulating film 221, the element separation layer 220, the pixel electrode 23B, the organic layer 24, and the common electrode 25. Note that each of the light-emitting elements 20 may be considered as including the reflection section 210.

Here, the optical distance L0 between the reflection layer 21 and the common electrode 25 is different for each sub-pixel P0. Specifically, the optical distance L0 in the sub-pixel PR is set in correspondence with the red wavelength region. The optical distance L0 in the sub-pixel PG is set in correspondence with the green wavelength region. The optical distance L0 in the sub-pixel PB is set in correspondence with the blue wavelength region.

Therefore, each light-emitting element 20 has an optical resonance structure 29 that resonates light of a predetermined wavelength region between the reflection layer 21 and the common electrode 25. The light-emitting elements 20R, 20G, 20B have optical resonance structures 29 that differ from one another. The optical resonance structure 29 reflects the light generated in the light-emitting layer of the organic layer 24 by multiple reflection between the reflection layer 21 and the common electrode 25, and selectively intensifies light in a predetermined wavelength region. The light-emitting element 20R has an optical resonance structure 29R that intensifies light in the red wavelength region between the reflection layer 21 and the common electrode 25. The light-emitting element 20G has an optical resonance structure 29G that intensifies light in the green wavelength region between the reflection layer 21 and the common electrode 25. The light-emitting element 20B has an optical resonance structure 29B that intensifies light in the blue wavelength region between the reflection layer 21 and the common electrode 25.

A resonance wavelength at the optical resonance structure 29 is determined by the optical distance L0. Given $\lambda 0$ as the resonance wavelength, a relationship [1] such as below holds true. Note that $\Phi$ (radian) in the relationship [1] represents the sum of the phase shifts that occur during transmission and reflection between the reflection layer 21 and the common electrode 25.

$$\{(2 \times L0)/\lambda 0 + \Phi\}/(2\pi) = m0 \text{ (where } m0 \text{ is an integer)} \quad [1]$$

The optical distance L0 is set such that a peak wavelength of light in a wavelength region to be extracted is $\lambda 0$. By this setting, light in the predetermined wavelength region to be extracted is enhanced, and the light can be increased in intensity and a spectrum of the light can be narrowed.

In this exemplary embodiment, as described above, the optical distance L0 is adjusted by varying a thickness of the insulating layer 22 for each of the sub-pixels PB, PG, PR. Note that the method for adjusting the optical distance L0 is not limited to a method of adjusting the thickness of the insulating layer 22. For example, the optical distance L0 may be adjusted by varying a thickness of the pixel electrode 23 for each of the sub-pixels PB, PG, PR.

The protective layer 4 is disposed on the plurality of light-emitting elements 20. The protective layer 4 protects the plurality of light-emitting elements 20. Specifically, the protective layer 4 seals the plurality of light-emitting elements 20 to protect the plurality of light-emitting elements 20 from the outside. The protective layer 4 has gas barrier properties, and protects each light-emitting element 20 from external moisture and oxygen, for example. With the protective layer 4 thus provided, deterioration of the light-emitting element 20 can be suppressed compared to a case in which the protective layer 4 is not provided. Therefore, reliability of the quality of the electro-optical device 100 can be increased. Note that, because the electro-optical device 100 is a top-emission type, the protective layer 4 has optical transparency.

The protective layer 4 includes a first layer 41, a second layer 42, and a third layer 43. The first layer 41, the second layer 42, and the third layer 43 are layered in this order in a direction away from the light-emitting element layer 2. The first layer 41, the second layer 42, and the third layer 43 have insulating properties. A material of the first layer 41 and the third layer 43 is, for example, an inorganic compound such as silicon oxynitride (SiON). The second layer 42 is a layer for providing a flat surface to the third layer 43. A material of the second layer 42 is, for example, a resin such as an epoxy resin or an inorganic compound.

The color filter 5 selectively transmits light in a predetermined wavelength region. The predetermined wavelength region includes the peak wavelength $\lambda 0$ determined by the optical distance L0 described above. With use of the color filter 5, a color purity of the light emitted from each sub-pixel P0 can be increased compared to a case in which the color filter 5 is not used. The color filter 5 is formed from a resin material such as an acrylic photosensitive resin material containing a color material, for example. The color material is a pigment or a dye. The color filter 5 is formed using, for example, a spin coating method, a printing method, or an ink-jet method.

The light-transmitting substrate 7 is bonded onto the element substrate 1 via the adhesive layer 70. The adhesive layer 70 is a transparent adhesive that uses a resin material such as epoxy resin and an acrylic resin, for example.

Figure 5:
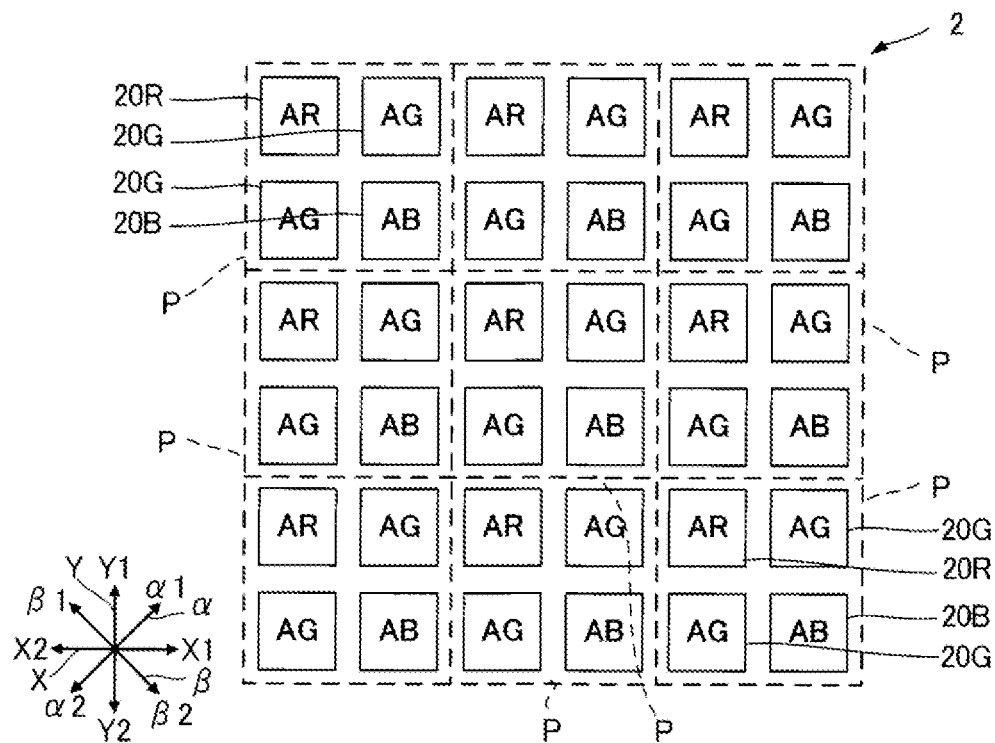
FIG. 5 is a schematic plan view illustrating a portion of a light-emitting element layer in the first exemplary embodiment.

FIG. 5 is a schematic plan view illustrating a portion of the light-emitting element layer 2 of the first exemplary embodiment. Hereinafter, for convenience of explanation, description will be made appropriately using an a-axis intersecting the X-axis and the Y-axis in the X-Y plane and a axis intersecting the X-axis and the Y-axis in the X-Y plane. The X-axis, the Y-axis, and the Z-axis are mutually orthogonal. The a-axis is inclined 45° with respect to each of the X-axis and the Y-axis. The β-axis is inclined 45° with respect to each of the X-axis and the Y-axis. Further, one direction along the α-axis is referred to as an α1 direction, and a direction opposite the α1 direction is referred to as an α2 direction. One direction along the β-axis is referred to as a β1 direction, and a direction opposite the β1 direction is referred to as a β2 direction.

As illustrated in FIG. 5, the light-emitting element layer 2 includes one light-emitting element 20R, one light-emitting element 20B, and two light-emitting elements 20G for each pixel P. The light-emitting element 20R corresponds to a "first light-emitting element", and the light-emitting element 20B corresponds to a "third light-emitting element". In this exemplary embodiment, one of the two light-emitting elements 20G provided in each pixel P corresponds to a "second light-emitting element" and the other corresponds to a "fourth light-emitting element."

The light-emitting element 20R includes the light-emitting region AR that emits light in a wavelength region including a red wavelength region. The red wavelength region is greater than 580 nm and less than or equal to 700 nm. The light-emitting element 20G includes the light-emitting region AG that emits light in a wavelength region including a green wavelength region. The green wavelength region is greater than or equal to 500 nm and less than or equal to 580 nm. The light-emitting element 20B includes a light-emitting region AB that emits light in a wavelength region including a blue wavelength region. The blue wavelength region is specifically greater than or equal to 400 nm and less than 500 nm.

Further, the light-emitting region AR corresponds to a "first light-emitting region", and the light-emitting region AB corresponds to a "third light-emitting region". The light-emitting region AG of the light-emitting element 20G corresponding to the "second light-emitting element" corresponds to "a second light-emitting region", and the light-emitting region AG of the light-emitting element 20G corresponding to the "fourth light-emitting element" corresponds to a "fourth light-emitting region".

As previously mentioned, the array of the sub-pixels P0 is a Bayer array. Therefore, an array of the light-emitting regions A is a Bayer array. Thus, one light-emitting region AR, one light-emitting region AB, and two light-emitting regions AG constitute one set, and the two light-emitting regions AG are disposed diagonally with respect to the array direction of the pixels P. In the Bayer array, the light-emitting elements 20 are disposed in two rows and two columns in one pixel P.

Specifically, in each of the pixels P, the two light-emitting regions AG are disposed side by side in the al direction. One light-emitting region AG of the two light-emitting regions AG is disposed in the X1 direction with respect to the light-emitting region AR, and the other light-emitting region AG is disposed in the Y2 direction with respect to the light-emitting region AR. In each of the pixels P, the light-emitting region AB is disposed in the β2 direction with respect to the light-emitting region AR. Further, for example, when focus is placed on the pixel P located at the center in FIG. 5, the light-emitting region AR existing in the pixel P is surrounded by four light-emitting regions AB and four light-emitting regions AG. Similarly, the light-emitting region AB existing in the pixel P is surrounded by four light-emitting regions AR and four light-emitting regions AG.

Note that, in the illustrated example, a shape of the light-emitting region A in plan view is substantially quadrangular, but is not limited thereto, and may be, for example, hexagonal. Shapes of the light-emitting regions AR, AG, AB in plan view are identical to one another, but may be different from one another. Areas of the light-emitting regions AR, AG, AB in plan view are equal to one another, but may be different from one another.

Figure 6:
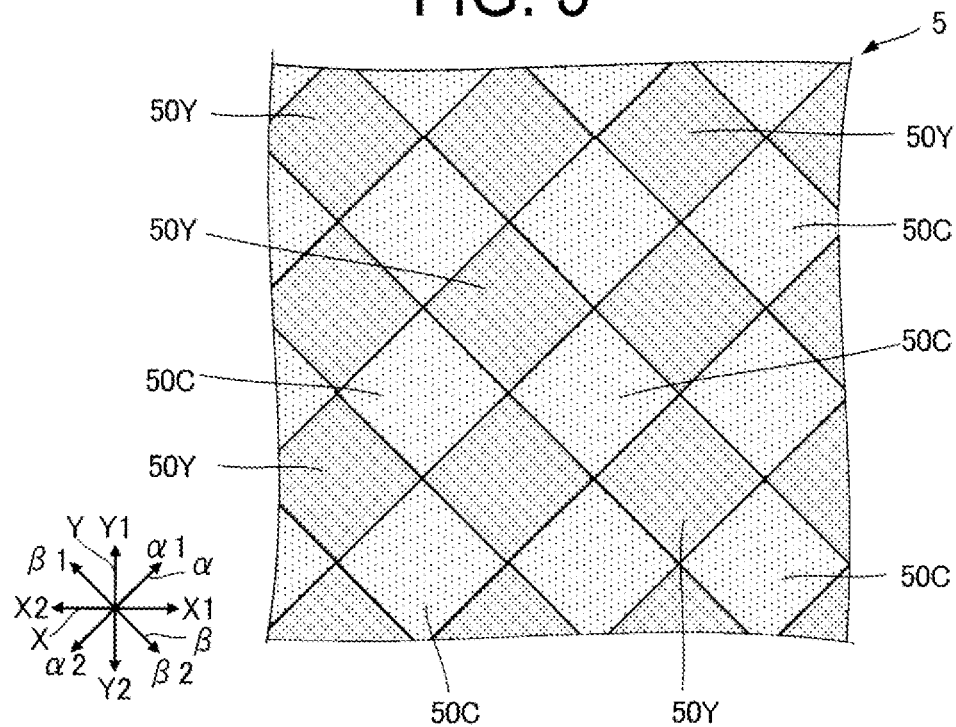
FIG. 6 is a schematic plan view illustrating a portion of a color filter in the first exemplary embodiment.

FIG. 6 is a schematic plan view illustrating a portion of the color filter 5 of the first exemplary embodiment. As illustrated in FIG. 6, the color filter 5 includes two types of filters. Specifically, the color filter 5 includes a plurality of yellow filters 50Y and a plurality of cyan filters 50C. The plurality of yellow filters 50Y and the plurality of cyan filters 50C are mutually located on the same plane. The yellow filter 50Y is a colored layer of yellow. The cyan filter 50C is a colored layer of cyan. Further, the yellow filter 50Y corresponds to a "first filter", and the cyan filter 50C corresponds to a "second filter".

The plurality of yellow filters 50Y are disposed in a staggered manner in plan view. The plurality of cyan filters 50C are disposed in a staggered manner in plan view. The plurality of yellow filters 50Y and the plurality of cyan filters 50C are alternately arranged in rows and columns in the α1 direction and the β2 direction. A boundary between the yellow filter 50Y and the cyan filter 50C adjacent to each other extends in the al direction or the β2 direction. Put another way, each side of an outer shape of each filter extends in the α1 direction or the β2 direction.

A shape of the yellow filter 50Y and the cyan filter 50C in plan view illustrated in FIG. 6 corresponds to the shape of the light-emitting region A in plan view illustrated in FIG. 5. In the illustrated example, the shape of the plurality of yellow filters 50Y and the plurality of cyan filters 50C is substantially quadrangular. Note that the shape of each of the yellow filter 50Y and the cyan filter 50C in plan view may be hexagonal, for example. Further, the shapes of the yellow filter 50Y and the cyan filter 50C are identical to each other, but may be different from each other.

Further, an area of each of the yellow filter 50Y and the cyan filter 50C in plan view illustrated in FIG. 6 is larger than the area of the light-emitting region A in plan view illustrated in FIG. 5. Note that the areas of the yellow filter 50Y and the cyan filter 50C in plan view are equal to each other, but may be different from each other.

Figure 7:
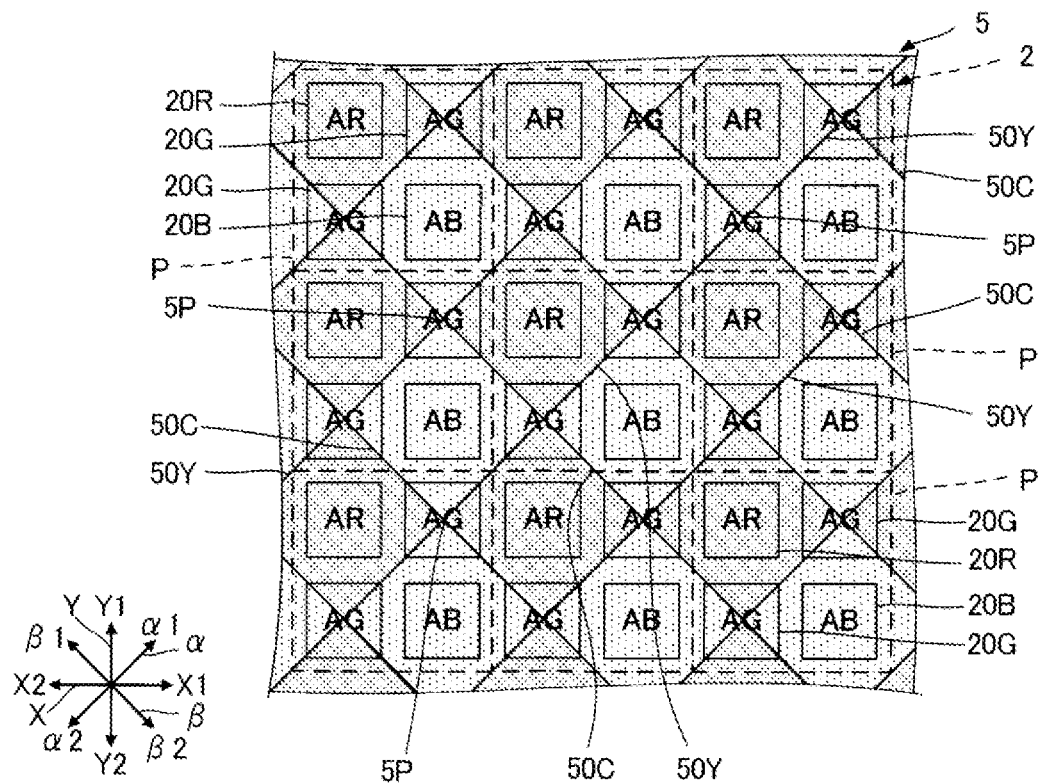
FIG. 7 is a schematic plan view illustrating an arrangement of the light-emitting element layer and the color filter in a first exemplary embodiment.

FIG. 7 is a schematic plan view illustrating an arrangement of the light-emitting element layer 2 and the color filter 5 in the first exemplary embodiment. As illustrated in FIG. 7, the color filter 5 overlaps the light-emitting element layer 2 in plan view. An array direction of the yellow filter 50Y and the cyan filter 50C intersects an array direction of the plurality of light-emitting regions A in plan view. As described above, the yellow filter 50Y and the cyan filter 50C are alternately disposed in rows and columns in the α1 direction and the β2 direction. On the other hand, the plurality of light-emitting regions A are arranged in rows and columns in the X1 direction and the Y2 direction.

The plurality of yellow filters 50Y are disposed in a one-to-one manner with the plurality of light-emitting regions AR. Each yellow filter 50Y is disposed in the X-Y plane in a state of being rotated by 45° with respect to the corresponding light-emitting region AR. Put another way, each yellow filter 50Y has a rectangular shape with an outer side disposed diagonally with respect to the X1 direction or the Y2 direction. Each light-emitting region AR overlaps the corresponding yellow filter 50Y in plan view.

Similarly, the plurality of cyan filters 50C are disposed in a one-to-one manner with the plurality of light-emitting regions AB. Each cyan filter 50C is disposed in the X-Y plane in a state of being rotated by 45° with respect to the corresponding light-emitting region AB. Put another way, each cyan filter 50C has a rectangular shape with an outer side disposed diagonally with respect to the X1 direction or the Y2 direction. Each light-emitting region AB overlaps the corresponding cyan filter 50C in plan view.

Further, in plan view, the yellow filter 50Y projects from the light-emitting region AR toward each of the four adjacent light-emitting regions AG. Therefore, in plan view, the yellow filter 50Y overlaps one light-emitting region AR and a portion of each of the four light-emitting regions AG. Note that the yellow filter 50Y does not overlap the light-emitting region AB in plan view. Similarly, in plan view, the cyan filter 50C projects from the light-emitting region AB toward each of the four adjacent light-emitting regions AG. Therefore, in plan view, the cyan filter 50C overlaps one light-emitting region AB and a portion of each of the four light-emitting regions AG. Note that the cyan filter 50C does not overlap the light-emitting region AR in plan view.

Accordingly, in plan view, the light-emitting region AG includes a portion overlapping the yellow filter 50Y and a portion overlapping the cyan filter 50C. In this exemplary embodiment, a portion of each of the two yellow filters 50Y and a portion of each of the two cyan filters 50C are disposed in a well-balanced manner on the light-emitting region AG. Further, a contact point 5P where the two yellow filters 50Y and the two cyan filters 50C come into contact with each other is located at the light-emitting region AG.

Figure 8:
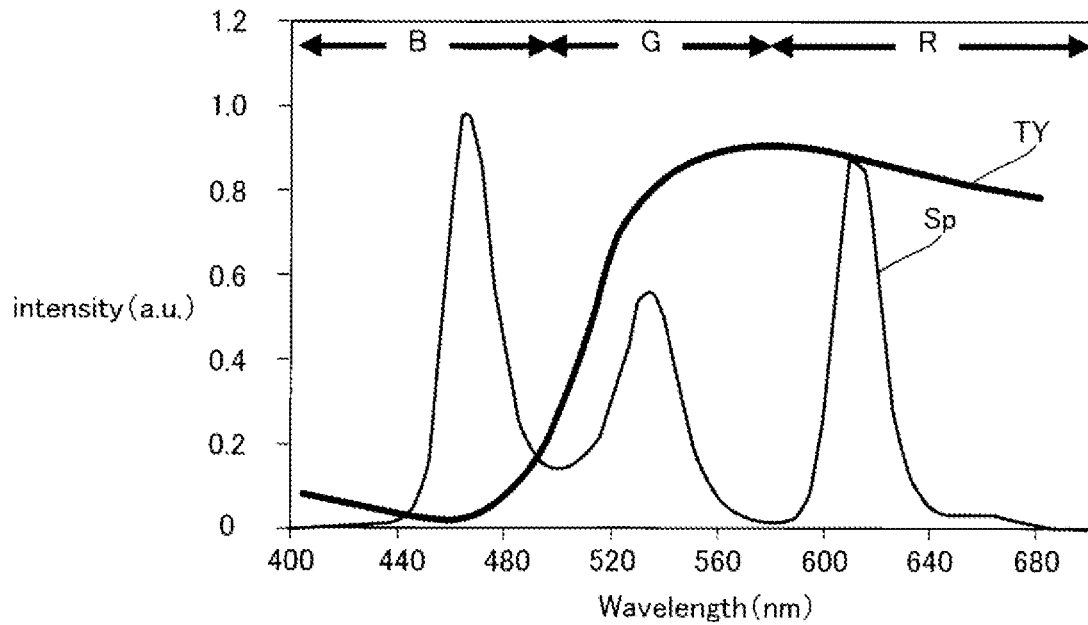
FIG. 8 is a diagram for explaining characteristics of a yellow filter.

FIG. 8 is a diagram for explaining characteristics of the yellow filter 50Y. In FIG. 8, a light emission spectrum Sp of the light-emitting element layer 2 and a transmission spectrum TY of the yellow filter 50Y are illustrated. The light emission spectrum Sp is a sum of spectra of the light-emitting elements 20 of the three colors.

As illustrated in FIG. 8, the yellow filter 50Y transmits light in the red wavelength region and light in the green wavelength region and absorbs light in the blue wavelength region. That is, the yellow filter 50Y has a low transmittance of light in the blue wavelength region with respect to each transmittance of light in the red wavelength region and light in the green wavelength region. The transmittance of light in the blue wavelength region of the yellow filter 50Y with respect to a wavelength of a maximum transmittance of visible light transmitted through the yellow filter 50Y is preferably not greater than 50% and more preferably not greater than 20%.

Figure 9:
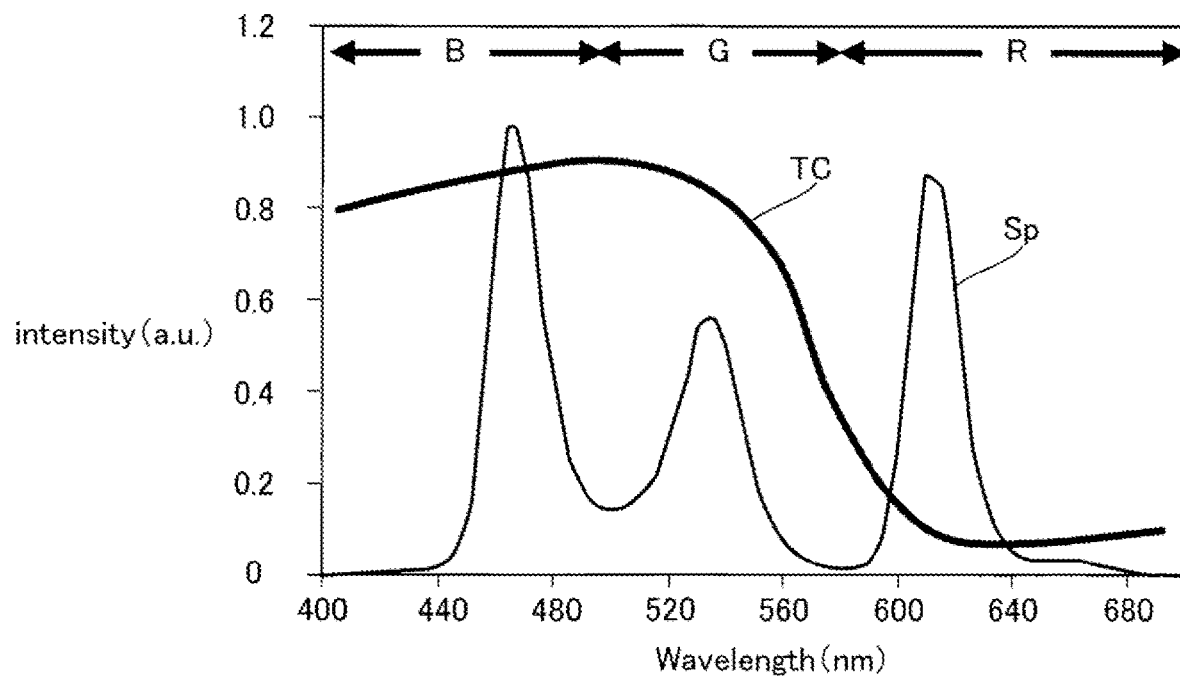
FIG. 9 is a diagram for explaining characteristics of a cyan filter.

FIG. 9 is a diagram for explaining characteristics of the cyan filter 50C. In FIG. 9, the light emission spectrum Sp of the light-emitting element layer 2 illustrated in FIG. 3 and a transmission spectrum TC of the cyan filter 50M are illustrated.

As illustrated in FIG. 9, the cyan filter 50C transmits light in the green wavelength region and light in the blue wavelength region and absorbs light in the red wavelength region. That is, the cyan filter 50C has a low transmittance of light in the red wavelength region with respect to each transmittance of light in the green wavelength region and light in the blue wavelength region. The transmittance of light in the red wavelength region of the cyan filter 50C with respect to a wavelength of a maximum transmittance of visible light transmitted through the cyan filter 50C is preferably not greater than 50% and more preferably not greater than 20%.

Figure 10:
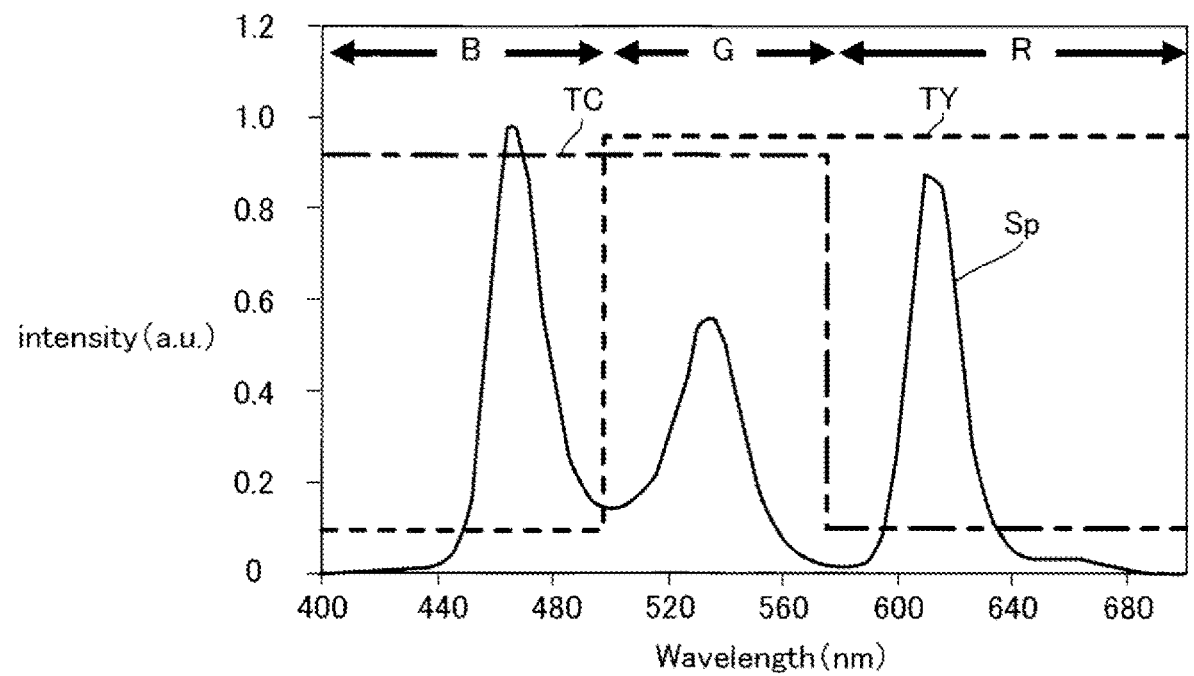
FIG. 10 is a diagram for explaining characteristics of the color filter.

FIG. 10 is a diagram for explaining characteristics of the color filter 5. In FIG. 10, for convenience of explanation, the transmission spectrum TY of the yellow filter 50Y and the transmission spectrum TC of the cyan filter 50C are simplified.

As illustrated in FIG. 10, by using the two types of filters of the yellow filter 50Y and the cyan filter 50C, the color filter 5 can transmit light in the red, green, and blue wavelength regions.

Figure 11:
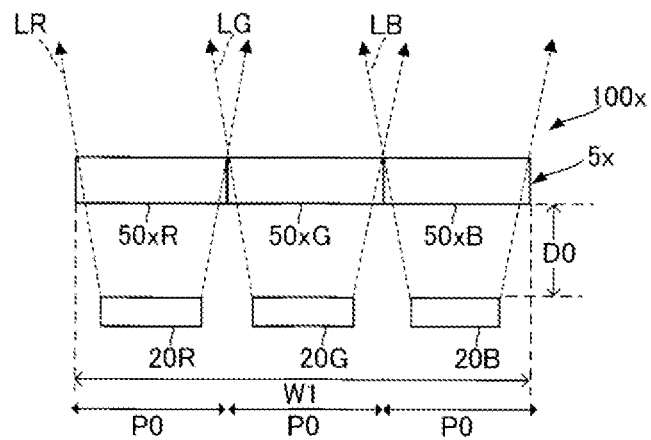
FIG. 11 is a schematic view illustrating an electro-optical device including a color filter in the related art.

FIG. 11 is a schematic view illustrating an electro-optical device 100x including a color filter 5x in the related art. "x" is added to the reference signs of elements associated with the electro-optical device 100x in the related art.

The color filter 5x included in the electro-optical device 100x includes a filter corresponding to the light-emitting element 20x for each sub-pixel P0. The color filter 5x includes a filter 50xR that selectively transmits light in the red wavelength region, a filter 50xG that selectively transmits light in the green wavelength region, and a filter 50xB that selectively transmits light in the blue wavelength region. Although a plan view is omitted, the filter 50xR overlaps the light-emitting element 20R in plan view, the filter 50xG overlaps the light-emitting element 20G in plan view, and the filter 50xB overlaps the light-emitting element 20B in plan view.

In the electro-optical device 100x, light LG in the green wavelength region emitted from the light-emitting element 20G is transmitted through the filter 50xG. Note that the light LG in the green wavelength region is absorbed by the filter 50xR and the filter 50xB adjacent to the filter 50xG. Further, light LR in the red wavelength region emitted from the light-emitting element 20R is transmitted through the filter 50xR. Note that, although not illustrated in detail, the light LR in the red wavelength region is abosobed by the filter 50xG and the filter 50xB adjacent to the filter 50xR. Similarly, light LB in the blue wavelength region emitted from the light-emitting element 20B is transmitted through the filter 50xB. Note that, although not illustrated in detail, the light LB in the blue wavelength region is absorbed by the filter 50xG and the filter 50xR adjacent to the filter 50xB.

Figure 12:
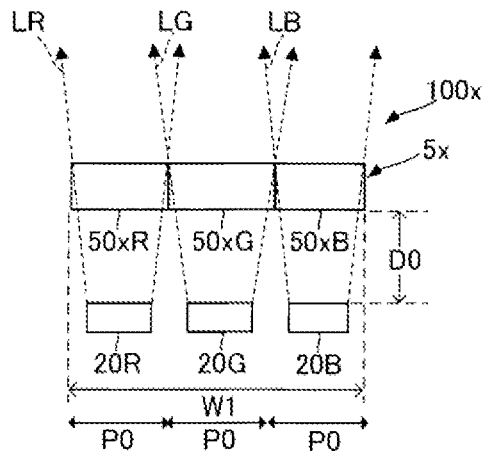
FIG. 12 is a schematic view illustrating an example of a case in which the electro-optical device of FIG. 11 is reduced in size.

FIG. 12 is a schematic view illustrating an example of a case in which the electro-optical device 100x of FIG. 11 is reduced in size. In order to reduce the size of the electro-optical device 100x in FIG. 11, as illustrated in FIG. 12, when a width W1 of the pixel P is reduced, a width of each sub-pixel P0 is also reduced. Note that a distance DO between the color filter 5x and each light-emitting element 20x is unchanged. As the width of the sub-pixel P0 decreases, a width of each of the filters 50x also decreases. As a result, a spread angle of light transmitted through the color filter 5x decreases. Specifically, a spread angle of the light LG transmitted through the filter 50xG, a spread angle of the light LR transmitted through the filter 50xR, and a spread angle of the light LB transmitted through the filter 50xB decrease.

Figure 13:
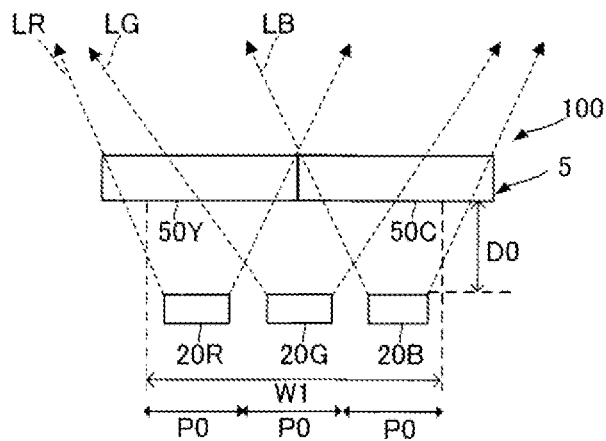
FIG. 13 is a schematic view illustrating the electro-optical device of the first exemplary embodiment.

FIG. 13 is a schematic view illustrating the electro-optical device 100 of the first exemplary embodiment. As illustrated in FIG. 13, the color filter 5 of this exemplary embodiment includes two types of filters, and the filters are not disposed for each sub-pixel P0. Therefore, in the electro-optical device 100, the number of types of filters included in the color filter 5 is less than the number of types of the light-emitting elements 20. Then, in the electro-optical device 100, the yellow filter 50Y overlaps the light-emitting element 20R and the light-emitting element 20G in plan view, and the cyan filter 50C overlaps the light-emitting element 20G and the light-emitting element 20B in plan view.

As described above, the light LG in the green wavelength region emitted from the light-emitting element 20G is transmitted through the yellow filter 50Y and the cyan filter 50C. Thus, the light LG is transmitted through the color filter 5 without being absorbed by the color filter 5.

Further, light LR in the red wavelength region emitted from the light-emitting element 20R is transmitted through the yellow filter 50Y. The light LB in the blue wavelength region emitted from the light-emitting element 20B is transmitted through the cyan filter 50C. As described above, the number of types of filters included in the color filter 5 is less than the number of types of light-emitting elements 20. Therefore, the width of each filter can be made larger than that in the related art. Thus, the width of the yellow filter 50Y can be made large compared to the width of the filter 50xR in the related art. As a result, the spread angle of the light LR transmitted through the yellow filter 50Y can be made greater than the spread angle of the light LR transmitted through the filter 50xR in the related art. Similarly, the width of the cyan filter 50C can be made large compared to the width of the filter 50xB in the related art. As a result, the spread angle of the light LB transmitted through the cyan filter 50C can be made greater than the spread angle of the light LB transmitted through the filter 50xB in the related art.

As described above, the light-emitting element layer 2 includes the light-emitting element 20R that emits light in the red wavelength region, the light-emitting element 20G that emits light in the green wavelength region, and the light-emitting element 20B that emits light in the blue wavelength region. Further, the color filter 5 includes the yellow filter 50Y that transmits light in the red wavelength region and light in the green wavelength region and absorbs light in the blue wavelength region, and the cyan filter 50C that transmits light in the green wavelength region and light in the blue wavelength region and absorbs light in the red wavelength region. With such a color filter 5 including the two types of filters, light in the red, green, and blue wavelength regions can be transmitted as described above.

Further, with such two types of filters provided for the three types of light-emitting elements 20, a planar area of each of the filters can be made large compared to a case in which three types of filters corresponding to each of the three types of light-emitting elements 20 are provided. This makes it possible to suppress the absorbing of light from each of the light-emitting elements 20 by the filter. Thus, the spread angle of light is suppressed from becoming smaller than that in the related art. Therefore, even if the width of the sub-pixels P0 decreases or the density of the sub-pixels P0 increases, it is possible to suppress the possibility of deterioration in visual field angle characteristics. Further, the absorbing of the light from each of the light-emitting elements 20 by the filter is suppressed, and thus an opening ratio of each of the sub-pixels P0 can be improved.

In particular, the color filter 5 includes the two types of filters that transmit light in the green wavelength region. Thus, light in the green wavelength region is less likely to be absorbed by the filter compared to light in the wavelength regions of other colors. For example, when an intensity of light in the green wavelength region is higher than intensities of light in other wavelength regions in accordance with a desired color balance, a difference in the intensities of light in each wavelength region can be suppressed by using two types of filters that transmit light in the green wavelength region. Furthermore, in the light-emitting element layer 2, a total area of the light-emitting region AG in each of the pixels P is largest. In this way, when a light emission intensity of the light-emitting element 20G is to be high compared to those of the other light-emitting elements 20, for example, the difference in the intensity of light in each wavelength region can be suppressed over a long period.

Further, as described above, the light-emitting region AR overlaps the yellow filter 50Y in plan view. Therefore, the light from the light-emitting region AR can be efficiently made incident on the yellow filter 50Y compared to a case in which the yellow filter 50Y is disposed offset with respect to the light-emitting region AR in plan view. Similarly, the light-emitting region AB overlaps the cyan filter 50C in plan view. Therefore, the light from the light-emitting region AB can be efficiently made incident on the cyan filter 50C compared to a case in which the cyan filter 50C is disposed offset with respect to the light-emitting region AB in plan view. Further, the light-emitting region AG overlaps both the yellow filter 50Y and the cyan filter 50C in plan view. Therefore, the light from the light-emitting region AG can be efficiently made incident on the yellow filter 50Y and the cyan filter 50C compared to a case in which the yellow filter 50Y and the cyan filter 50C are disposed offset with respect to the light-emitting region AG in plan view. Accordingly, the electro-optical device 100 that is bright and has a wide visual field angle can be realized.

Furthermore, as illustrated in FIG. 7, the array of the light-emitting regions A is a Bayer array, and each of the light-emitting regions AG overlaps both the yellow filter 50Y and the cyan filter 50C in plan view. Therefore, in one pixel P, the yellow filter 50Y and the cyan filter 50C are disposed side by side in the β2 direction intersecting the α1 direction in which the two light-emitting regions AG are aligned. Put another way, the color filter 5 is disposed with respect to the light-emitting element layer 2 so that the array direction of the plurality of pixels P and the array direction of the plurality of yellow filters 50Y and the plurality of cyan filters 50C intersect. Therefore, in this exemplary embodiment, in each of the pixels P, two filters are disposed with respect to the four light-emitting regions A arranged in two rows and two columns. Thus, compared to a case in which four filters are provided in a one-to-one manner with the four light-emitting regions A included in each of the pixels P, an increase in the total number of the yellow filters 50Y and the cyan filters 50C can be suppressed. Therefore, the yellow filters 50Y and the cyan filters 50C can be efficiently disposed.

Specifically, as illustrated in FIG. 7, the yellow filter 50Y located at the light-emitting region AR is disposed projecting from the light-emitting region AR to the four adjacent light-emitting regions AG in plan view. Similarly, the cyan filter 50C located at the light-emitting region AB is disposed projecting from the light-emitting region AB to the four adjacent light-emitting regions AG in plan view. Thus, a portion of the yellow filter 50Y and a portion of the cyan filter 50C overlap the light-emitting region AG in plan view.

Therefore, light in the red wavelength region from the light-emitting region AR spreads from the light-emitting region AR onto the four adjacent light-emitting regions AG and is transmitted through the yellow filter 50Y. Similarly, light in the blue wavelength region from the light-emitting region AB spreads from the light-emitting region AB onto the four adjacent light-emitting regions AG and is transmitted through the cyan filter 50C. Furthermore, light in the green wavelength region from the light-emitting region AG is transmitted through the yellow filter 50Y and the cyan filter 50C. Therefore, light in the green wavelength region from the light-emitting region AG is transmitted through the color filter 5 without being absorbed by the filter.

Accordingly, according to the electro-optical device 100, light emitted from the light-emitting region A spreads in the X1, X2, Y1, and Y2 directions from the light-emitting region A and is transmitted through the color filter 5. Therefore, even if the width of the sub-pixels P0 decreases or the density of the sub-pixels P0 increases, it is possible to effectively suppress deterioration in visual field angle characteristics.

Further, with the array of the light-emitting elements 20 being a Bayer array, the three types of light-emitting elements 20 are disposed in two rows and two columns in each of the pixels P. Therefore, for example, the visual field angle characteristics can be improved compared to a stripe array in which three types of light-emitting elements 20 are aligned in three row and one column, and a rectangle array described later.

In particular, with the array being a Bayer array, the difference in visual field angle characteristics in the X1, X2, Y1, and Y2 directions can be reduced due to the combination of the sub-pixels P0 adjacent to one another. Thus, by using the light-emitting element layer 2 in which the array of the light-emitting elements 20 is a Bayer array and the color filter 5, it is possible to suppress deterioration in visual field angle characteristics in various directions.

Further, as described above, the light-emitting element 20R, the light-emitting element 20G, and the light-emitting element 20B have mutually different optical resonance structures 29. The light-emitting element 20R has the optical resonance structure 29R that intensifies light in the red wavelength region, the light-emitting element 20G has the optical resonance structure 29G that intensifies light in the green wavelength region, and the light-emitting element 20B has the optical resonance structure 29B that intensifies light in the blue wavelength region. By providing the optical resonance structure 29, it is possible to intensify the light and narrow the spectrum of light. With use of the color filter 5 with the light-emitting element 20 having such an optical resonance structure 29, it is possible to enhance color purity and visual field angle characteristics.

1B. Second Exemplary Embodiment

A second exemplary embodiment will be described. Note that, for elements having the same functions as those of the first exemplary embodiment in each of the following examples, the reference signs used in the description of the first exemplary embodiment will be used and detailed description thereof will be omitted as appropriate.

Figure 14:
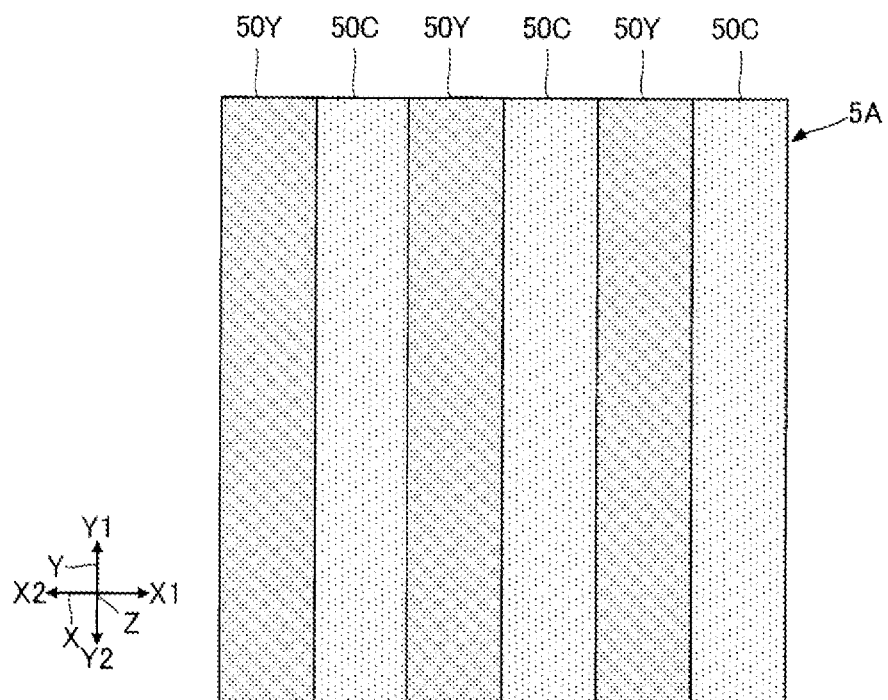
FIG. 14 is a schematic plan view illustrating a portion of a color filter in a second exemplary embodiment.

FIG. 14 is a schematic plan view illustrating a portion of a color filter 5A in the second exemplary embodiment. The second exemplary embodiment is the same as the first exemplary embodiment except that the color filter 5A is different from the color filter 5 of the first exemplary embodiment. Hereinafter, items of the color filter 5A different from those of the color filter 5 of the first exemplary embodiment will be described, and description of the same items will be omitted.

The plurality of yellow filters 50Y and the plurality of cyan filters 50C included in the color filter 5A illustrated in FIG. 14 are arranged alternately in a stripe pattern. In the color filter 5A, two types of long filters of different colors are arranged alternately. In the illustrated example, the yellow filter 50Y and the cyan filter 50C each have a long shape in plan view extending in the Y2 direction.

Figure 15:
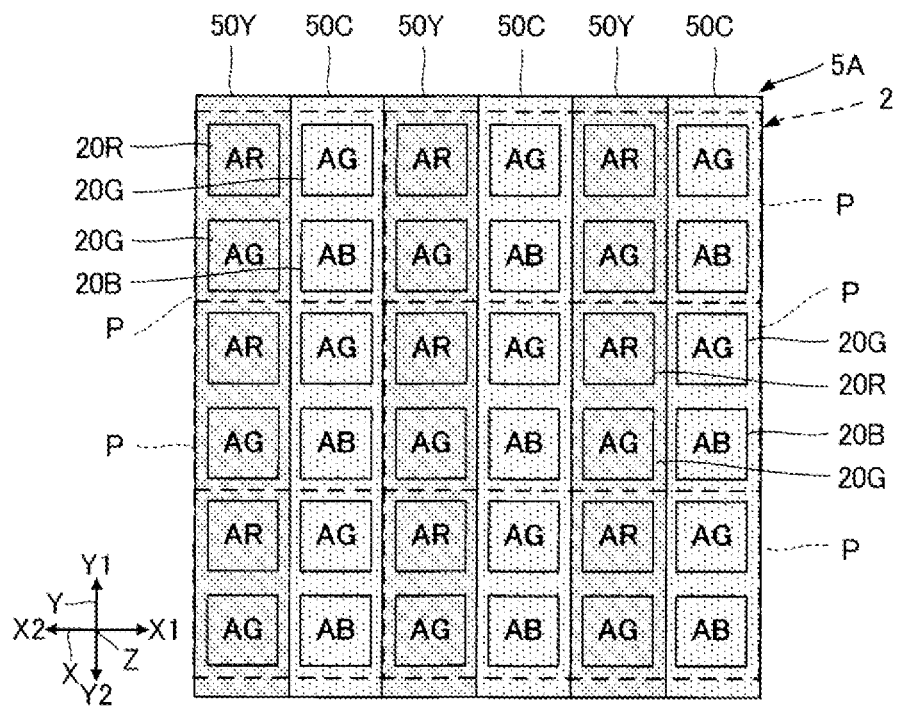
FIG. 15 is a schematic plan view illustrating an arrangement of a light-emitting element layer and the color filter in the second exemplary embodiment.

FIG. 15 is a schematic plan view illustrating an arrangement of the light-emitting element layer 2 and the color filter 5A in the second exemplary embodiment. As illustrated in FIG. 15, the plurality of yellow filters 50Y and the plurality of cyan filters 50C are arranged alternately in the X1 direction corresponding to the row direction of the plurality of light-emitting regions A. The yellow filters 50Y are disposed in odd number columns of the light-emitting regions A, and the cyan filters 50C are disposed in even number columns of the light-emitting regions A. Note that the column of the light-emitting regions A existing farthest in the X2 direction is a first column.

Each of the yellow filters 50Y overlaps all of the light-emitting regions A existing in the corresponding column in plan view. In the example illustrated in FIG. 15, each of the yellow filters 50Y overlaps three light-emitting regions AR and three light-emitting regions AG alternately arranged in the Y2 direction in plan view. Similarly, each of the cyan filters 50C overlaps all of the light-emitting regions A existing in the corresponding column in plan view. In the example illustrated in FIG. 15, each of the cyan filters 50C overlaps three light-emitting regions AG and three light-emitting regions AB alternately arranged in the Y2 direction in plan view. Further, in FIG. 15, respective widths of the yellow filter 50Y and the cyan filter 50C are slightly larger than a width of the light-emitting region A, but may be equal. Note that the width is a length in the X1 direction.

Put another way, two types of filters, one yellow filter 50Y and one cyan filter 50C, are disposed in each pixel P. In each pixel P, the light-emitting region AR overlaps the yellow filter 50Y in plan view. The light-emitting region AB overlaps the cyan filter 50C in plan view. The light-emitting region AG positioned in the Y2 direction with respect to the light-emitting region AR overlaps the yellow filter 50Y in plan view. The light-emitting region AG positioned in the X1 direction with respect to the light-emitting region AR overlaps the cyan filter 50C in plan view. In this exemplary embodiment, of the two light-emitting elements 20G provided in each pixel P, the light-emitting region AG positioned in the Y2 direction with respect to the light-emitting region AR corresponds to the "second light-emitting element", and the light-emitting region AG positioned in the X1 direction with respect to the light-emitting region AR corresponds to the "fourth light-emitting element".

With use of the color filter 5A described above, similar to the first exemplary embodiment, deterioration in the visual field angle characteristics and a decrease in the opening ratio can be suppressed even if the width of the sub-pixels P0 decreases or the density of the sub-pixels P0 increases.

Furthermore, as illustrated in FIG. 14, in this exemplary embodiment, the array of the light-emitting regions A is a Bayer array, one of the light-emitting regions AG overlaps the yellow filter 50Y in plan view, and the other light-emitting region AG overlaps the cyan filter 50C. Therefore, the yellow filter 50Y and the cyan filter 50C are disposed in a stripe pattern. Thus, the total number of the yellow filters 50Y and the cyan filters 50C can be further reduced, and the yellow filters 50Y and the cyan filters 50C can be more efficiently disposed, than in the first exemplary embodiment.

As described above, in plan view, each of the yellow filters 50Y has a long shape extending in the Y2 direction and overlaps the plurality of light-emitting regions AR and the plurality of light-emitting regions AG aligned in the Y2 direction. Therefore, light in the red wavelength region from the light-emitting region AR spreads not only directly above the light-emitting region AR but also in the Y1 direction and the Y2 direction from the light-emitting region AR and is transmitted through the yellow filter 50Y. Further, in plan view, each of the cyan filters 50C has a long shape extending in the Y2 direction and overlaps the plurality of light-emitting regions AG and the plurality of light-emitting regions AB aligned in the Y2 direction. Therefore, light in the blue wavelength region from the light-emitting region AB spreads not only directly above the light-emitting region AB but also in the Y1 direction and the Y2 direction from the light-emitting region AB and is transmitted through the cyan filter 50C. Furthermore, light in the green wavelength region from the light-emitting region AG is transmitted through the color filter 5A without being absorbed by the filter.

Accordingly, in this exemplary embodiment as well, similar to the first exemplary embodiment, light from the light-emitting element 20 is absorbed by the filter as in the related art, thereby suppressing a decrease in the spread angle of the light. In particular, by using the color filter 5A when the array of the light-emitting regions A is a Bayer array, it is possible to widen the visual field angles of light in the red and blue wavelength regions in the Y1 direction and the Y2 direction. Thus, the electro-optical device 100 of this exemplary embodiment is effective for use in devices that particularly require visual field angle characteristics in the Y1 direction and the Y2 direction. It is desirable to select an optimum form in accordance with intended use.

The light-emitting element layer 2 and the color filter 5A of the second exemplary embodiment described above can also, similar to the first exemplary embodiment, improve visual field angle characteristics.

1C: Third Exemplary Embodiment

A third exemplary embodiment will be described. Note that, for elements having the same functions as those of the first exemplary embodiment in each of the following examples, the reference signs used in the description of the first exemplary embodiment will be used and detailed description thereof will be omitted as appropriate.

Figure 16:
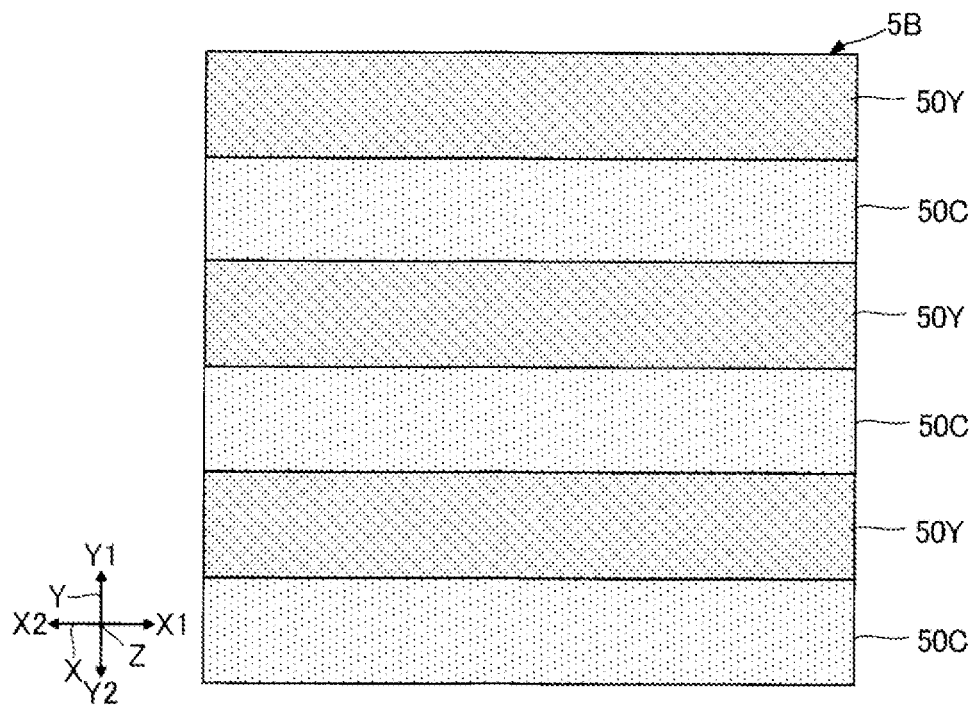
FIG. 16 is a schematic plan view illustrating a portion of a color filter in a third exemplary embodiment.

FIG. 16 is a schematic plan view illustrating a portion of a color filter 5B in the third exemplary embodiment. The third exemplary embodiment is the same as the first exemplary embodiment except that the color filter 5B is different from the color filter 5 of the first exemplary embodiment. Hereinafter, items of the color filter 5B that differ from those of the color filter 5 of the first exemplary embodiment will be described, and description of the same items will be omitted.

The plurality of yellow filters 50Y and the plurality of cyan filters 50C included in the color filter 5B illustrated in FIG. 16 are arranged alternately in a stripe pattern. In the color filter 5B, two types of long filters of different colors are arranged alternately. In the illustrated example, the yellow filter 50Y and the cyan filter 50C each have a long shape in plan view extending in the X1 direction. Note that the direction in which the color filter 5B of this exemplary embodiment is aligned is different from the direction in which the color filter 5 of the second exemplary embodiment is aligned.

Figure 17:
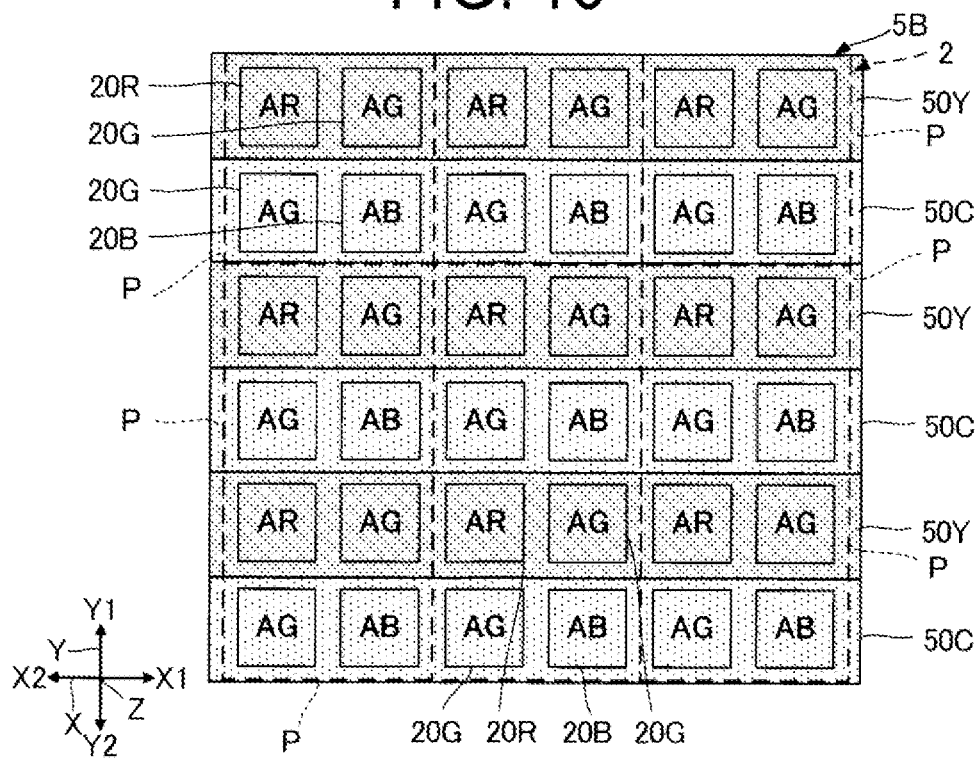
FIG. 17 is a schematic plan view illustrating an arrangement of the light-emitting element layer and the color filter in the third exemplary embodiment.

FIG. 17 is a schematic plan view illustrating an arrangement of the light-emitting element layer 2 and the color filter 5B in the third exemplary embodiment. As illustrated in FIG. 17, the plurality of yellow filters 50Y and the plurality of cyan filters 50C are arranged alternately in the Y2 direction corresponding to the column direction of the plurality of light-emitting regions A. The yellow filters 50Y are disposed in odd number row of the light-emitting regions A, and the cyan filters 50C are disposed in even number rows of the light-emitting regions A. Note that the row of the light-emitting regions A existing farthest in the Y1 direction is a first row.

Each of the yellow filters 50Y overlaps all of the light-emitting regions A existing in the corresponding row in plan view. In the example illustrated in FIG. 17, each of the yellow filters 50Y overlaps three light-emitting regions AR and three light-emitting regions AG alternately arranged in the X1 direction in plan view. Similarly, each of the cyan filters 50C overlaps all of the light-emitting regions A existing in the corresponding row in plan view. In the example illustrated in FIG. 17, each of the cyan filters 50C overlaps three light-emitting regions AG and three light-emitting regions AB alternately arranged in the X1 direction in plan view. Therefore, the yellow filter 50Y and the cyan filter 50C are disposed in a stripe pattern. Note that the width is a length in the Y1 direction.

Put another way, two types of filters, one yellow filter 50Y and one cyan filter 50C, are disposed in each pixel P. In each pixel P, the light-emitting region AR overlaps the yellow filter 50Y in plan view. The light-emitting region AB overlaps the cyan filter 50C in plan view. The light-emitting region AG positioned in the X1 direction with respect to the light-emitting region AR overlaps the yellow filter 50Y in plan view. The light-emitting region AG positioned in the Y2 direction with respect to the light-emitting region AR overlaps the cyan filter 50C in plan view. In this exemplary embodiment, of the two light-emitting elements 20G provided in each pixel P, the light-emitting region AG positioned in the X1 direction with respect to the light-emitting region AR corresponds to the "second light-emitting element", and the light-emitting region AG positioned in the Y2 direction with respect to the light-emitting region AR corresponds to the "fourth light-emitting element".

With use of the color filter 5B described above, similar to the first exemplary embodiment, deterioration in the visual field angle characteristics and a decrease in the opening ratio can be suppressed even if the width of the sub-pixels P0 decrease or the density of the sub-pixels P0 increases.

Furthermore, as illustrated in FIG. 17, in this exemplary embodiment, the array of the light-emitting regions A is a Bayer array, one of the light-emitting regions AG overlaps the yellow filter 50Y in plan view, and the other light-emitting region AG overlaps the cyan filter 50C. Therefore, the yellow filter 50Y and the cyan filter 50C are disposed in a stripe pattern. Thus, the total number of the yellow filters 50Y and the cyan filters 50C can be further reduced, and the yellow filters 50Y and the cyan filters 50C can be more efficiently disposed, than in the first exemplary embodiment.

In plan view, each of the yellow filters 50Y has a long shape extending in the X1 direction and overlaps the plurality of light-emitting regions AR and the plurality of light-emitting regions AG aligned in the X1 direction. Therefore, light in the red wavelength region from the light-emitting region AR spreads not only directly above the light-emitting region AR but also in the X1 direction and the X2 direction from the light-emitting region AR and is transmitted through the yellow filter 50Y. Further, in plan view, each of the cyan filters 50C has a long shape extending in the X1 direction and overlaps the plurality of light-emitting regions AG and the plurality of light-emitting regions AB aligned in the X1 direction. Therefore, light in the blue wavelength region from the light-emitting region AB spreads not only directly above the light-emitting region AB but also in the X1 direction and the X2 direction from the light-emitting region AB and is transmitted through the cyan filter 50C. Furthermore, light in the green wavelength region from the light-emitting region AG is transmitted through the color filter 5B without being absorbed by the filter.

Accordingly, in this exemplary embodiment as well, similar to the first exemplary embodiment, light from the light-emitting element 20 is absorbed by the filter as in the related art, thereby suppressing a decrease in the spread angle of the light. In particular, by using the color filter 5B when the array of the light-emitting regions A is a Bayer array, it is possible to widen the visual field angles of light in the red and blue wavelength regions in the X1 direction and the X2 direction. Thus, the electro-optical device 100 of this exemplary embodiment is effective for use in devices that particularly require visual field angle characteristics in the X1 direction and the X2 direction. It is desirable to select an optimum form in accordance with intended use.

The light-emitting element layer 2 and the color filter 5B of the third exemplary embodiment described above can also, similar to the first exemplary embodiment, improve the visual field angle characteristics.

1D. Fourth Exemplary Embodiment

A fourth exemplary embodiment will be described. Note that, for elements having the same functions as those of the third exemplary embodiment in each of the following examples, the reference signs used in the description of the third exemplary embodiment will be used and detailed description thereof will be omitted as appropriate.

Figure 18:
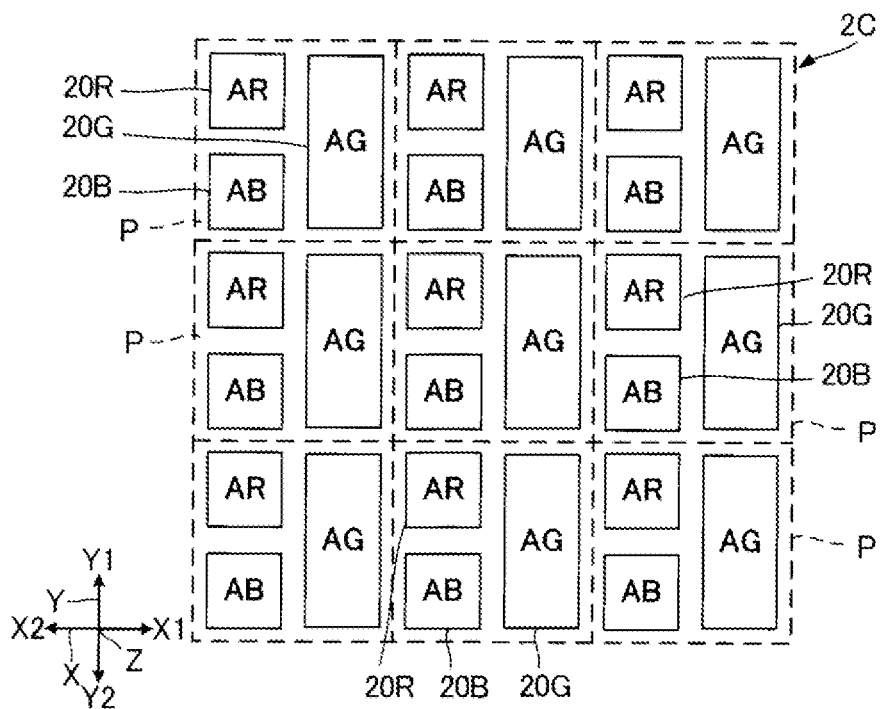
FIG. 18 is a schematic plan view illustrating a portion of a light-emitting element layer of a fourth exemplary embodiment.

FIG. 18 is a schematic plan view illustrating a portion of a light-emitting element layer 2C of a fourth exemplary embodiment. The fourth exemplary embodiment is the same as the third exemplary embodiment except that the light-emitting element layer 2C is different from the light-emitting element layer 2 of the first exemplary embodiment. Hereinafter, items of the light-emitting element 2C that differ from those of the light-emitting element 2 of the third exemplary embodiment will be described, and description of the same items will be omitted.

Note that in this exemplary embodiment, although not illustrated, the array of the sub-pixels P0 is a rectangle array. The rectangle array is an array in which one sub-pixel PR, one sub-pixel PG, and one sub-pixel PB form a single pixel P, and differs from a stripe array. The direction in which the three sub-pixels P0 in the rectangle array are aligned is not one direction.

As illustrated in FIG. 18, the light-emitting element layer 2C includes one light-emitting element 20R, one light-emitting element 20G, and one light-emitting element 20B for each pixel P. The array of the light-emitting regions A is a rectangle array. Thus, one light-emitting region AR, one light-emitting region AG, and one light-emitting region AB constitute one set. Furthermore, the direction in which the light-emitting region AR and the light-emitting region AB are aligned differs from the direction in which the light-emitting region AR and the light-emitting region AG are aligned and the direction in which the light-emitting region AB and the light-emitting region AG are aligned. The direction in which the light-emitting region AR and the light-emitting region AG are aligned and the direction in which the light-emitting region AB and the light-emitting region AG are aligned are the same, and in the illustrated example, the direction is the X1 direction. The direction in which the light-emitting region AR and the light-emitting region AB are aligned is the Y2 direction.

Further, in the rectangle array of this exemplary embodiment, the area of the light-emitting region AG of the three light-emitting regions A is largest. The light-emitting region AG is rectangular, and each of the light-emitting region AR and the light-emitting region AB is square. In the Y2 direction, the light-emitting region AG is wider than the light-emitting regions AR and AB. Note that the areas of the light-emitting regions AR and AB in plan view are equal to each other, but may be different from each other. Further, the plurality of light-emitting regions AR and the plurality of light-emitting regions AB are aligned in the Y2 direction. Similarly, the plurality of light-emitting regions AG are aligned in the Y2 direction. The columns in which the plurality of light-emitting regions AR and the plurality of light-emitting regions AB are aligned and the columns in which the plurality of light-emitting regions AG are aligned are alternately disposed in the X1 direction. Further, one light-emitting region AR, one light-emitting region AG, and one light-emitting region AB of each pixel P in this exemplary embodiment are considered to fall within two rows and two columns of the sub-pixel P0 of the first exemplary embodiment. In each pixel P, the area of the light-emitting region AG in plan view of this exemplary embodiment is greater than or equal to a total area of the two light-emitting regions AG in plan view of the first exemplary embodiment.

Figure 19:
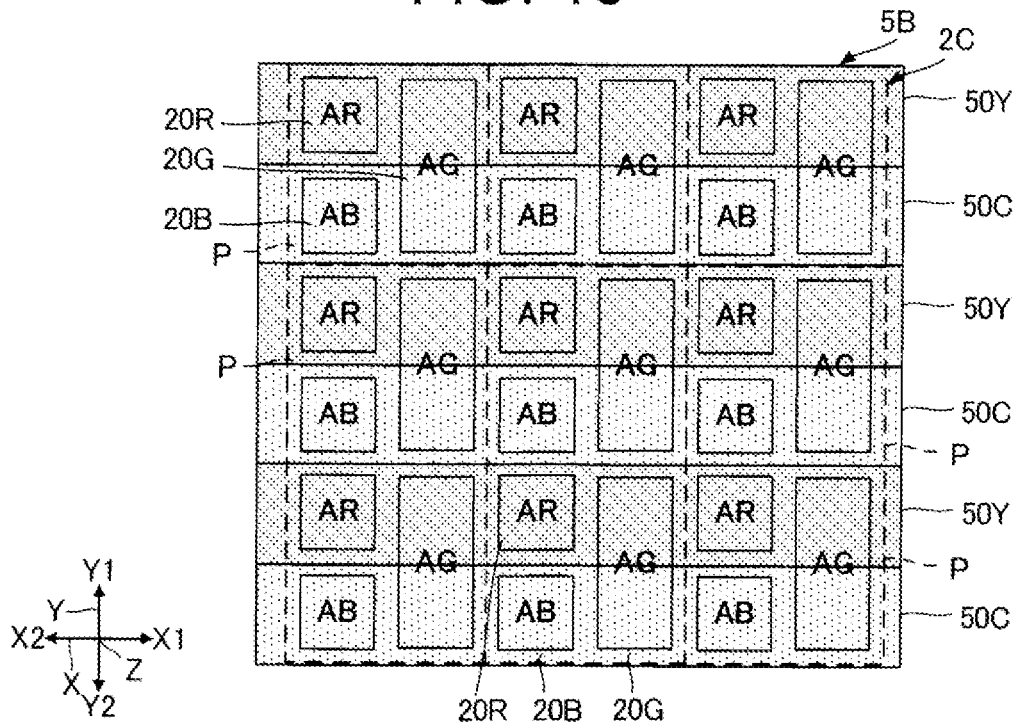
FIG. 19 is a schematic plan view illustrating an arrangement of the light-emitting element layer and the color filter in the fourth exemplary embodiment.

FIG. 19 is a schematic plan view illustrating an arrangement of the light-emitting element layer 2C and the color filter 5B in the fourth exemplary embodiment. As illustrated in FIG. 19, the light-emitting region AR overlaps the yellow filter 50Y in plan view. The light-emitting region AB overlaps the cyan filter 50C in plan view. In plan view, the light-emitting region AG includes a portion overlapping the yellow filter 50Y and a portion overlapping the cyan filter 50C. Thus, the light-emitting region AG overlaps both the yellow filter 50Y and the cyan filter 50C in plan view.

In this exemplary embodiment as well, similar to the third exemplary embodiment, light in the red wavelength region from the light-emitting region AR spreads from the light-emitting region AR in the X1 direction and the X2 direction and is transmitted through the yellow filter 50Y. Further, light in the blue wavelength region from the light-emitting region AB spreads from the light-emitting region AB in the X1 direction and the X2 direction and is transmitted through the cyan filter 50C. Furthermore, light in the green wavelength region from the light-emitting region AG is transmitted through the color filter 5B without being absorbed by the filter.

Accordingly, similar to the third exemplary embodiment, by using the light-emitting element layer 2C and the color filter 5B, it is possible to suppress the absorbing of light from the light-emitting elements 20 by the filter. This makes it possible to improve the opening ratio for each sub-pixel P0 and improve the visual field angle characteristics.

Further, in this exemplary embodiment, as described above, the array of the light-emitting regions AR, AG, AB is a rectangle array, and a planar area of the light-emitting region AG is largest. Then, the plurality of yellow filters 50Y and the plurality of cyan filters 50C are arranged in a stripe pattern in the direction in which the light-emitting region AR and the light-emitting region AB are aligned. When the light-emitting regions A are a rectangle array, the plurality of yellow filters 50Y and the plurality of cyan filters 50C are disposed in a stripe pattern, and thus a filter need not be provided for each of the three types of sub-pixels P0. Therefore, the yellow filters 50Y and the cyan filters 50C can be efficiently disposed. Thus, the spread angle of the light of each color can be increased. Further, with the two types of filters disposed in a stripe pattern, each filter and the light-emitting element layer 2C can be brought into close contact over a wider area compared to a case in which a filter is disposed for each of the three types of sub-pixels P0. This facilitates design and manufacture.

Further, as described above, in the Bayer array of the first exemplary embodiment, four of the light-emitting elements 20 are provided for each of the pixels P. In contrast, in the rectangle array, three of the light-emitting elements 20 are provided for each of the pixels P. Thus, with the rectangle array, the number of light-emitting elements 20 can be reduced compared to a case in which the array is a Bayer array. Therefore, the planar area of the light-emitting region AG can be increased. Thus, the opening ratio of the light-emitting region AG can be improved.

The light-emitting element layer 2C and the color filter 5B of the fourth exemplary embodiment described above can also, similar to the third exemplary embodiment, improve the visual field angle characteristics.

1E. Modification Example

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise.

While, in each exemplary embodiment, the light-emitting element 20 has the optical resonance structure 29 having a different resonance wavelength for each color, the light-emitting element need not have the optical resonance structure 29. Further, the light-emitting element layer 2 may, for example, include a partition wall configured to partition the organic layer 24 for each of the light-emitting elements 20. Further, the light-emitting element 20 may include different light-emitting materials for each of the sub-pixels P0. Further, the pixel electrode 23 may have light reflectivity. In this case, the reflection layer 21 may be omitted. Further, although the common electrode 25 is common to the plurality of light-emitting elements 20, an individual cathode may be provided for each of the light-emitting elements 20.

In the first exemplary embodiment, the filters of the color filter 5 are disposed in contact with each other, but a so-called black matrix may be interposed between the filters of the color filter 5. Further, the filters of the color filter 5 may include portions that overlap each other. Note that the same applies to other exemplary embodiments.

The array of the light-emitting regions A is not limited to a Bayer array and a rectangle array, and may be, for example, a delta array or a stripe array.

The "electro-optical device" is not limited to an organic EL device, and may be an inorganic EL device that uses an inorganic material or a p-light-emitting diode (LED) device.

The row direction and the column direction of the plurality of pixels P may intersect at less than 90° rather than being orthogonal to each other. Similarly, the row direction and the column direction of the plurality of filters in the first exemplary embodiment may intersect at less than 90° rather than being orthogonal to each other.

2. Electronic Apparatus

The electro-optical device 100 of the exemplary embodiments described above is applicable to various electronic apparatuses.

2-1. Head-Mounted Display

Figure 20:
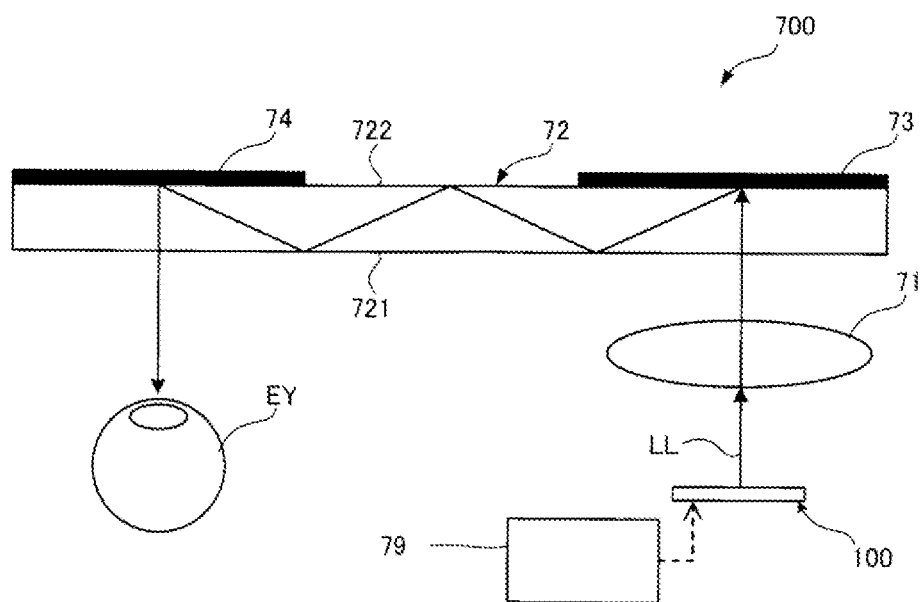
FIG. 20 is a plan view schematically illustrating a portion of a virtual display device as an example of an electronic apparatus.

FIG. 20 is a plan view schematically illustrating a portion of a virtual display device 700 as an example of an electronic apparatus. The virtual display apparatus 700 illustrated in FIG. 20 is a head-mounted display (HMD) mounted on a head of an observer and configured to display an image. The virtual display apparatus 700 includes the electro-optical device 100 described above, a collimator 71, a light guide 72, a first reflection-type volume hologram 73, a second reflection-type volume hologram 74, and a control unit 79. Note that light emitted from the electro-optical device 100 is emitted as image light LL.

The control unit 79 includes a processor and a memory, for example, and controls the operation of the electro-optical device 100. The collimator 71 is disposed between the electro-optical device 100 and the light guide 72. The collimator 71 collimates light emitted from the electro-optical device 100. The collimator 71 is constituted by a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light therein. A light incident port on which light is incident and a light emission port from which light is emitted are provided in a surface 721 of the light guide 72 facing the collimator 71. The first reflection-type volume hologram 73 as a diffractive optical element and the second reflection-type volume hologram 74 as a diffractive optical element are disposed on a surface 722 of the light guide 72 opposite to the surface 721. The second reflection-type volume hologram 74 is provided closer to the light emission port side than the first reflection-type volume hologram 73. The first reflection-type volume hologram 73 and the second reflection-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incident port travels while being repeatedly reflected, and is guided to an eye EY of an observer from a light emission port, and thus the observer can observe an image constituted by a virtual image formed by the image light LL.

The virtual display apparatus 700 includes the electro-optical device 100 described above. The electro-optical device 100 described above has excellent visual field angle characteristics and good quality. Therefore, a virtual display apparatus 700 having high display quality can be provided by including the electro-optical device 100.

2-2. Personal Computer

Figure 21:
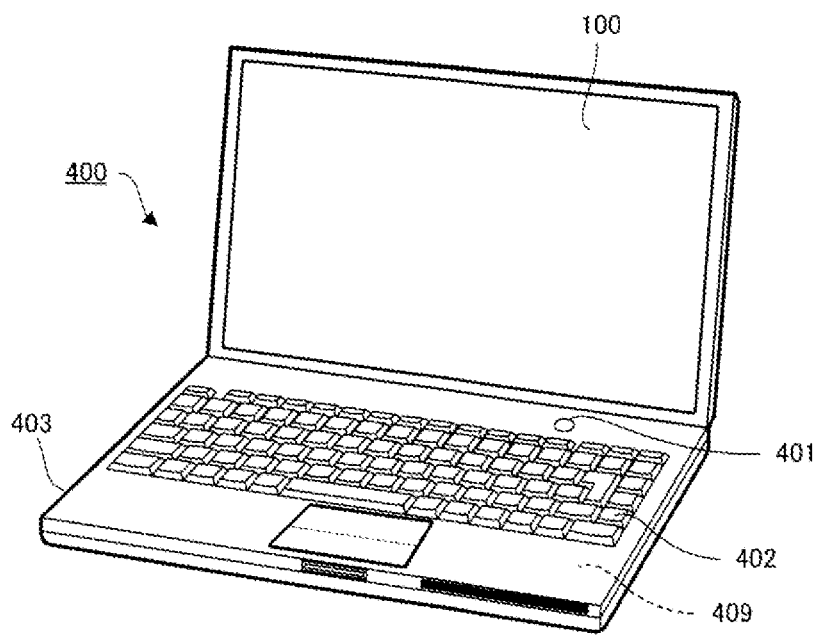
FIG. 21 is a perspective view illustrating a personal computer as an example of the electronic apparatus.

FIG. 21 is a perspective view illustrating a personal computer 400 as an example of the electronic apparatus in the present disclosure. The personal computer 400 illustrated in FIG. 21 includes the electro-optical device 100, a main body 403 provided with a power switch 401 and a keyboard 402, and a control unit 409. The control unit 409 includes a processor and a memory, for example, and controls the operation of the electro-optical device 100. The electro-optical device 100 has superior viewing angle characteristics and has good quality. Therefore, the personal computer 400 having high display quality can be provided by including the electro-optical device 100.

Note that examples of the "electronic apparatus" including the electro-optical device 100 include, in addition to the virtual display apparatus 700 illustrated in FIG. 20 and the personal computer 400 illustrated in FIG. 21, an apparatus disposed close to eyes such as a digital scope, a digital binocular, a digital still camera, and a video camera. Further, the "electronic apparatus" including the electro-optical device 100 is applied as a mobile phone, a smartphone, a personal digital assistant (PDA), a car navigation device, and a vehicle-mounted display unit. Furthermore, the "electronic apparatus" including the electro-optical device 100 is applied as illumination for illuminating light.

The present disclosure was described above based on the illustrated exemplary embodiments. However, the present disclosure is not limited thereto. In addition, the configuration of each component of the present disclosure may be replaced with any configuration that exerts the equivalent functions of the above-described exemplary embodiments, and to which any configuration may be added. Further, any configuration may be combined with each other in the above-described exemplary embodiments of the present disclosure.

What is claimed is:

1. An electro-optical device, comprising:
   a first light-emitting element configured to emit light in a first wavelength region;
   a second light-emitting element configured to emit light in a second wavelength region shorter than the first wavelength region;
   a third light-emitting element configured to emit light in a third wavelength region shorter than the second wavelength region;
   a fourth light-emitting element configured to emit light in the second wavelength region;
   a first filter configured to transmit light in the first wavelength region and light in the second wavelength region and absorb light in the third wavelength region; and
   a second filter configured to transmit light in the second wavelength region and light in the third wavelength region and absorb light in the first wavelength region
   wherein
   the first filter and the second filter are both in a stripe pattern and extended in a same direction in a plan view, and
   the first light-emitting element and the third light-emitting element are arranged in a first diagonal line, the second light-emitting element and the fourth light-emitting element are arranged in a second diagonal line, and an extending direction of the first diagonal line intersects an extending direction of the second diagonal line in the plan view.

2. The electro-optical device according to claim 1, wherein
   the first light-emitting element overlaps the first filter in the plan view,
   the third light-emitting element overlaps the second filter in the plan view, and
   the second light-emitting element overlaps one or both of the first filter and the second filter in the plan view.

3. The electro-optical device according to claim 2, wherein
   an array of the first light-emitting element, the second light-emitting element, the third light-emitting element, and the fourth light-emitting element is a Bayer array,
   the second light-emitting element overlaps the first filter in the plan view, and
   the fourth light-emitting element overlaps the second filter in the plan view.

4. The electro-optical device according to claim 1, wherein
   the first light-emitting element, the second light-emitting element, and the third light-emitting element have optical resonance structures that differ from one another.

5. An electronic apparatus, comprising:
   the electro-optical device according to claim 1; and
   a control unit configured to control operation of the electro-optical device.

6. An electro-optical device, comprising:
   a first light-emitting element configured to emit light in a first wavelength region;
   a second light-emitting element configured to emit light in a second wavelength region shorter than the first wavelength region;
   a third light-emitting element configured to emit light in a third wavelength region shorter than the second wavelength region;
   a fourth light-emitting element configured to emit light in the second wavelength region;
   a first filter configured to transmit light in the first wavelength region and light in the second wavelength region and absorb light in the third wavelength region; and
   a second filter configured to transmit light in the second wavelength region and light in the third wavelength region and absorb light in the first wavelength region,
   wherein
   an array of the first light-emitting element, the second light-emitting element, the third light-emitting element, and the fourth light-emitting element is a Bayer array,
   the first filter and the second filter are both in a stripe pattern and extended in a same direction,
   the first light-emitting element overlaps the first filter in a plan view,
   the second light-emitting element overlaps the first filter in the plan view,
   the third light-emitting element overlaps the second filter in the plan view,
   the fourth light-emitting element overlaps the second filter in the plan view, and
   in the plan view, the second light-emitting element and the fourth light-emitting element are disposed diagonally with respect to an array direction of a plurality of pixels arranged in the Bayer array.

* * * * *